US006979202B2

(12) United States Patent  
Benham et al.

(10) Patent No.: US 6,979,202 B2
(45) Date of Patent: Dec. 27, 2005

(54) HIGH-SPEED ELECTRICAL CONNECTOR

(75) Inventors: John E. Benham, Torrington, CT (US); Kenny Padro, Hamden, CT (US); Robert D. Godburn, Jr., Waterbury, CT (US)

(73) Assignee: Litton Systems, Inc., Los Angeles, CA (US)

( * ) Notice: Subject to any disclaimer, the term of this patent is extended or adjusted under 35 U.S.C. 154(b) by 0 days.

(21) Appl. No.: 10/893,430

(22) Filed: Jul. 19, 2004

(65) Prior Publication Data

US 2005/0048842 A1 Mar. 3, 2005

Related U.S. Application Data

(63) Continuation-in-part of application No. 10/234,859, filed on Sep. 5, 2002, and a continuation-in-part of application No. 10/036,796, filed on Jan. 7, 2002, now Pat. No. 6,843,657.

(60) Provisional application No. 60/487,580, filed on Jul. 17, 2003, provisional application No. 60/328,396, filed on Oct. 21, 2001, provisional application No. 60/260,893, filed on Jan. 12, 2001.

(51) Int. Cl.[7] .............................................. H01R 12/00
(52) U.S. Cl. ........................................ 439/65; 439/608
(58) Field of Search ......................... 439/65, 701, 608, 439/607, 108

(56) References Cited

U.S. PATENT DOCUMENTS

| | | | |
|---|---|---|---|
| 3,035,244 A | 5/1962 | Aveni |
| 3,208,028 A | 9/1965 | Mittler |
| 3,432,801 A | 3/1969 | Ruotolo |
| 3,564,343 A | 2/1971 | Guest |
| 3,636,239 A | 1/1972 | Robbins |
| 3,761,842 A | 9/1973 | Gandrud |
| 3,825,874 A | 7/1974 | Peverill |
| 4,008,941 A | 2/1977 | Smith |
| 4,017,770 A | 4/1977 | Valfre |
| 4,148,543 A | 4/1979 | Shores |
| 4,157,612 A | 6/1979 | Rainal |
| 4,175,821 A | 11/1979 | Hunter |
| 4,206,963 A | 6/1980 | English |
| 4,211,466 A | 7/1980 | Reynolds |
| 4,265,549 A | 5/1981 | Cote |
| 4,331,370 A | 5/1982 | Andrews |
| 4,338,717 A | 7/1982 | Damon |
| 4,382,653 A | 5/1983 | Blanchard |
| 4,397,516 A | 8/1983 | Koren |
| 4,457,574 A | 7/1984 | Walters |
| 4,477,022 A | 10/1984 | Shuey |
| 4,571,014 A | 2/1986 | Robin |
| 4,596,432 A | 6/1986 | Tighe, Jr. |
| 4,686,607 A | 8/1987 | Johnson |
| 4,689,721 A | 8/1987 | Damerow |
| 4,697,858 A | 10/1987 | Balakrishnan |
| 4,705,332 A | 11/1987 | Sadigh-Behzadi |
| 4,755,765 A | 7/1988 | Ferland |
| 4,806,107 A | 2/1989 | Arnold |

(Continued)

FOREIGN PATENT DOCUMENTS

EP 0284245 9/1988

(Continued)

Primary Examiner—P. Austin Bradley
Assistant Examiner—X. Chung-Trans
(74) Attorney, Agent, or Firm—Rothwell, Figg, Ernst & Manbeck

(57) ABSTRACT

The present invention provides a high-speed electrical interconnection system designed to overcome the drawbacks of conventional interconnection systems. That is, the present invention provides an electrical connector capable of handling high-speed signals effectively.

33 Claims, 36 Drawing Sheets

U.S. PATENT DOCUMENTS

| | | |
|---|---|---|
| 4,816,791 A | 3/1989 | Carnahan |
| 4,820,170 A | 4/1989 | Redmond |
| 4,836,791 A | 6/1989 | Grabbe |
| 4,846,727 A | 7/1989 | Glover |
| 4,861,272 A | 8/1989 | Clark |
| 4,867,707 A | 9/1989 | Widdoes |
| 4,871,321 A | 10/1989 | Johnson |
| 4,891,616 A | 1/1990 | Renken |
| 4,898,539 A | 2/1990 | Glover |
| 4,900,258 A | 2/1990 | Hnatuck |
| 4,924,918 A | 5/1990 | Lin |
| 4,941,831 A | 7/1990 | Tengler |
| 4,946,392 A | 8/1990 | Kobler |
| 4,947,144 A | 8/1990 | Le-Nohaic |
| 4,975,084 A | 12/1990 | Fedder |
| 4,979,903 A | 12/1990 | Gosselin |
| 4,988,306 A | 1/1991 | Hopfer, III |
| 5,007,843 A | 4/1991 | Smolley |
| RE33,611 E | 6/1991 | Michaels |
| 5,027,088 A | 6/1991 | Shimizu |
| 5,037,314 A | 8/1991 | Bricaud |
| 5,046,960 A | 9/1991 | Fedder |
| 5,055,069 A | 10/1991 | Townsend |
| 5,066,236 A | 11/1991 | Broeksteeg |
| 5,083,238 A | 1/1992 | Bousman |
| 5,104,341 A | 4/1992 | Gilissen |
| 5,114,355 A | 5/1992 | Kimmel |
| 5,118,300 A | 6/1992 | Zarreii |
| 5,119,886 A | 6/1992 | Fletcher |
| 5,122,064 A | 6/1992 | Zarreii |
| 5,122,065 A | 6/1992 | Dudek |
| 5,127,837 A | 7/1992 | Shah |
| 5,158,471 A | 10/1992 | Fedder |
| 5,163,834 A | 11/1992 | Chapin |
| 5,167,531 A | 12/1992 | Broschard, III |
| 5,169,343 A | 12/1992 | Andrews |
| 5,174,770 A | 12/1992 | Sasaki |
| 5,175,928 A | 1/1993 | Grabbe |
| 5,186,647 A | 2/1993 | Denkmann |
| 5,197,893 A | 3/1993 | Morlion |
| 5,199,906 A | 4/1993 | Wang |
| 5,215,473 A | 6/1993 | Brunker |
| 5,226,835 A | 7/1993 | Baker, III |
| 5,249,974 A | 10/1993 | Wang |
| 5,259,773 A | 11/1993 | Champion |
| 5,277,590 A | 1/1994 | Thomas |
| 5,282,754 A | 2/1994 | Kish |
| 5,286,212 A | 2/1994 | Broeksteeg |
| 5,292,256 A | 3/1994 | Brunker |
| 5,295,867 A | 3/1994 | Bethurum |
| 5,299,956 A | 4/1994 | Brownell |
| 5,316,489 A | 5/1994 | Kachlic |
| 5,334,962 A | 8/1994 | Higgins |
| 5,340,334 A | 8/1994 | Nguyen |
| 5,342,211 A | 8/1994 | Broeksteeg |
| 5,354,219 A | 10/1994 | Wanjura |
| 5,380,216 A | 1/1995 | Broeksteeg |
| 5,387,114 A | 2/1995 | Brunker |
| 5,388,997 A | 2/1995 | Grange |
| 5,395,249 A | 3/1995 | Reynolds |
| 5,399,105 A | 3/1995 | Kaufman |
| 5,401,912 A | 3/1995 | Mattei |
| 5,404,117 A | 4/1995 | Walz |
| 5,414,393 A | 5/1995 | Rose |
| 5,429,520 A | 7/1995 | Morlion |
| 5,432,484 A | 7/1995 | Klas |
| 5,433,618 A | 7/1995 | Morlion |
| 5,443,401 A | 8/1995 | Champion |
| 5,443,617 A | 8/1995 | Takahashi |
| 5,454,738 A | 10/1995 | Lim |
| 5,460,533 A | 10/1995 | Broeksteeg |
| 5,467,040 A | 11/1995 | Nelson |
| 5,470,244 A | 11/1995 | Lim |
| 5,479,321 A | 12/1995 | Mair |
| 5,483,020 A | 1/1996 | Hardie |
| 5,484,310 A | 1/1996 | McNamara |
| 5,490,787 A | 2/1996 | Bowman |
| 5,495,075 A | 2/1996 | Jonckheere |
| 5,496,183 A | 3/1996 | Soes |
| 5,501,613 A | 3/1996 | Lenoir |
| 5,513,065 A | 4/1996 | Caveney |
| 5,516,294 A | 5/1996 | Andrews |
| 5,522,727 A | 6/1996 | Saito |
| 5,539,360 A | 7/1996 | Vannatta |
| 5,547,405 A | 8/1996 | Pinney |
| 5,552,565 A | 9/1996 | Cartier |
| 5,552,752 A | 9/1996 | Sturdivant |
| 5,554,038 A | 9/1996 | Morlion |
| 5,577,935 A | 11/1996 | Harting |
| 5,586,914 A | 12/1996 | Foster, Jr. |
| 5,597,313 A | 1/1997 | Lindeman |
| 5,605,477 A | 2/1997 | Wu |
| 5,618,205 A | 4/1997 | Riddle |
| 5,620,340 A | 4/1997 | Andrews |
| 5,624,268 A | 4/1997 | Maeda |
| 5,626,497 A | 5/1997 | Bouchan |
| 5,632,634 A | 5/1997 | Soes |
| 5,633,615 A | 5/1997 | Quan |
| 5,647,770 A | 7/1997 | Belopolsky |
| 5,658,156 A | 8/1997 | Henderson |
| 5,661,901 A | 9/1997 | King |
| 5,664,968 A | 9/1997 | Mickievicz |
| 5,672,062 A | 9/1997 | Lindeman |
| 5,674,093 A | 10/1997 | Vaden |
| 5,675,302 A | 10/1997 | Howard |
| 5,697,817 A | 12/1997 | Bouchan |
| 5,699,228 A | 12/1997 | Lee |
| 5,700,167 A | 12/1997 | Pharney |
| 5,702,258 A | 12/1997 | Provencher |
| 5,704,794 A | 1/1998 | Lindeman |
| 5,704,795 A | 1/1998 | Lindeman |
| 5,716,237 A | 2/1998 | Conorich |
| 5,743,765 A | 4/1998 | Andrews |
| 5,788,512 A | 8/1998 | Lindeman |
| 5,789,994 A | 8/1998 | Case |
| 5,791,947 A | 8/1998 | Crane, Jr. |
| 5,795,190 A | 8/1998 | Ono |
| 5,795,191 A | 8/1998 | Preputnick |
| 5,816,826 A | 10/1998 | Colemen |
| 5,823,795 A | 10/1998 | Schumacher ................ 439/76 |
| 5,828,226 A | 10/1998 | Higgins |
| 5,834,335 A | 11/1998 | Buschbom ................ 438/107 |
| 5,842,873 A | 12/1998 | Gonzales |
| RE36,065 E | 1/1999 | Andrews |
| 5,886,590 A | 3/1999 | Quan |
| 5,888,096 A | 3/1999 | Soes |
| 5,890,915 A | 4/1999 | Reylek |
| 5,895,276 A | 4/1999 | Rothenberger |
| 5,931,687 A | 8/1999 | McFarlane |
| 5,940,278 A | 8/1999 | Schumacher |
| 5,949,656 A | 9/1999 | Pinault |
| 5,955,889 A | 9/1999 | Taguchi |
| 5,961,355 A | 10/1999 | Morlion |
| 5,967,844 A | 10/1999 | Doutrich |
| 5,967,850 A | 10/1999 | Crane, Jr. |
| 5,967,853 A | 10/1999 | Hashim |
| 5,980,321 A | 11/1999 | Cohen |
| 5,981,870 A | 11/1999 | Barcley |
| 5,984,710 A | 11/1999 | Kodama |
| 5,993,255 A | 11/1999 | Yurko |
| 5,993,256 A | 11/1999 | Shimojyo |
| 5,993,259 A | 11/1999 | Stokoe |
| 6,010,373 A | 1/2000 | Donahue |
| 6,012,927 A | 1/2000 | Longueville |

| | | |
|---|---|---|
| 6,039,580 A | 3/2000 | Sciarretta |
| 6,042,388 A | 3/2000 | Tustaniwskyj |
| 6,042,394 A | 3/2000 | Mitra |
| 6,046,410 A | 4/2000 | Wojnarowski |
| 6,050,842 A | 4/2000 | Ferrill |
| 6,062,870 A | 5/2000 | Hopfer, III |
| 6,083,047 A | 7/2000 | Paagman |
| 6,123,554 A | 9/2000 | Ortega |
| 6,132,244 A | 10/2000 | Leeman |
| 6,146,202 A | 11/2000 | Ramey |
| 6,183,301 B1 | 2/2001 | Paagman |
| 6,206,729 B1 | 3/2001 | Bradley |
| 6,220,896 B1 | 4/2001 | Bertoncini |
| 6,231,391 B1 | 5/2001 | Ramey |
| 6,234,807 B1 | 5/2001 | Amini |
| 6,236,287 B1 | 5/2001 | Quan |
| 6,238,245 B1 | 5/2001 | Stokoe |
| 6,247,972 B1 | 6/2001 | Crane, Jr. |
| 6,264,476 B1 | 7/2001 | Li |
| 6,267,604 B1 * | 7/2001 | Mickievicz et al. .......... 439/79 |
| 6,273,753 B1 | 8/2001 | Ko |
| 6,280,201 B1 | 8/2001 | Morris |
| 6,293,827 B1 | 9/2001 | Stokoe |
| 6,305,947 B1 | 10/2001 | Bruce |
| 6,307,391 B1 | 10/2001 | Tustaniwskyj |
| 6,316,719 B1 | 11/2001 | Pluymers |
| 6,343,955 B2 | 2/2002 | Billman |
| 6,347,962 B1 | 2/2002 | Kline |
| 6,364,710 B1 | 4/2002 | Billman |
| 6,371,813 B2 | 4/2002 | Ramey |
| 6,379,188 B1 | 4/2002 | Cohen |
| 6,380,485 B1 | 4/2002 | Beaman |
| 6,431,914 B1 | 8/2002 | Billman |
| 6,435,913 B1 | 8/2002 | Billman |
| 6,439,894 B1 | 8/2002 | Li |
| 6,461,197 B2 | 10/2002 | Crane, Jr. |
| 6,461,202 B2 | 10/2002 | Kline |
| 6,471,548 B2 | 10/2002 | Bertoncini |
| 6,482,038 B2 | 11/2002 | Olson |
| 6,491,545 B1 | 12/2002 | Spiegel |
| 6,503,103 B1 | 1/2003 | Cohen |
| 6,506,076 B2 | 1/2003 | Cohen |
| 6,517,360 B1 | 2/2003 | Cohen |
| 6,524,135 B1 | 2/2003 | Feldman |
| 6,527,587 B1 | 3/2003 | Ortega |
| 6,527,588 B2 | 3/2003 | Paagman |
| 6,540,522 B2 | 4/2003 | Sipe |
| 6,540,558 B1 * | 4/2003 | Paagman .................... 439/608 |
| 6,551,140 B2 | 4/2003 | Billman |
| 6,554,647 B1 | 4/2003 | Cohen |
| 6,565,387 B2 | 5/2003 | Cohen |
| 6,572,410 B1 | 6/2003 | Volstorf |
| 6,602,095 B2 | 8/2003 | Astbury, Jr. |
| 6,607,402 B2 | 8/2003 | Cohen |
| 6,623,310 B1 | 9/2003 | Billman |
| 6,652,319 B1 | 11/2003 | Billman |
| 6,663,427 B1 | 12/2003 | Billman |
| 6,663,429 B1 | 12/2003 | Korsunsky |
| 6,712,648 B2 | 3/2004 | Padro et al. |
| 6,743,057 B2 | 6/2004 | Davis |
| 6,843,657 B2 | 1/2005 | Driscoll et al. |
| 2001/0003077 A1 | 6/2001 | Van-Woensel |
| 2001/0005654 A1 | 6/2001 | Cohen |
| 2001/0012704 A1 | 8/2001 | Eldridge |
| 2001/0012729 A1 | 8/2001 | Van-Woensel |
| 2001/0012730 A1 | 8/2001 | Ramey |
| 2001/0041477 A1 | 11/2001 | Billman |
| 2002/0025721 A1 | 2/2002 | Bertoncini |
| 2002/0049229 A1 | 4/2002 | Pape |
| 2002/0081869 A1 | 6/2002 | Abbott |
| 2002/0094705 A1 | 7/2002 | Driscoll |
| 2002/0102869 A1 | 8/2002 | Ali |
| 2002/0102885 A1 | 8/2002 | Kline |
| 2002/0111068 A1 | 8/2002 | Cohen |
| 2002/0123266 A1 | 9/2002 | Ramey |
| 2002/0127893 A1 | 9/2002 | Brodsky |
| 2002/0137400 A1 | 9/2002 | Billman |
| 2002/0168898 A1 | 11/2002 | Billman |
| 2002/0173175 A1 | 11/2002 | Brodsky |
| 2002/0187663 A1 | 12/2002 | Li |
| 2003/0003803 A1 | 1/2003 | Billman |
| 2003/0073328 A1 | 4/2003 | Driscoll |
| 2003/0143894 A1 | 7/2003 | Kline |
| 2003/0186594 A1 | 10/2003 | Davis |
| 2003/0220019 A1 | 11/2003 | Billman |
| 2003/0220021 A1 | 11/2003 | Whiteman, Jr. |

FOREIGN PATENT DOCUMENTS

| | | |
|---|---|---|
| EP | 0422785 | 4/1991 |
| EP | 0442643 | 8/1991 |
| EP | 0446980 | 9/1991 |
| EP | 0488482 | 6/1992 |
| EP | 0555933 | 8/1993 |
| EP | 0583934 | 2/1994 |
| EP | 0654859 | 5/1995 |
| EP | 0752739 | 1/1997 |
| EP | 1087466 | 3/2001 |
| FR | 1400111 | 5/1965 |
| GB | 2344471 | 10/1999 |
| GB | 2371686 | 7/2001 |
| WO | WO94/16474 | 7/1994 |
| WO | WO97/02627 | 1/1997 |
| WO | WO97/18603 | 5/1997 |
| WO | WO00/24092 | 4/2000 |

* cited by examiner

HIGH-SPEED ELECTRICAL CONNECTOR

The present application claims the benefit of U.S. Provisional Patent Application No. 60/487,580, filed on Jul. 17, 2003; the present application is also a continuation-in-part of U.S. patent application Ser. No. 10/234,859, filed Sep. 5, 2002 (status pending), which is a continuation-in-part of U.S. patent application Ser. No. 10/036,796, filed Jan. 7, 2002 U.S. Pat. No. 6,843,657, which claims the benefit of U.S. Provisional Patent Application No. 60/260,893, filed on Jan. 12, 2001 and U.S. Patent Application No. 60/328,396, filed on Oct. 12, 2001. Each above identified application is incorporated herein by this reference.

BACKGROUND OF THE INVENTION

1. Field of the Invention

The present invention relates generally to electrical interconnection systems, and more specifically, to a high speed, high-density interconnection system for differential and single-ended transmission applications.

2. Discussion of the Background

Backplane systems are comprised of a complex printed circuit board that is referred to as the backplane or motherboard, and several smaller printed circuit boards that are referred to as daughtercards or daughterboards that plug into the backplane. Each daughtercard may include a chip that is referred to as a driver/receiver. The driver/receiver sends and receives signals from driver/receivers on other daughtercards. A signal path is formed between the driver/receiver on a first daughtercard and a driver/receiver on a second daughtercard. The signal path includes an electrical connector that connects the first daughtercard to the backplane, the backplane, a second electrical connector that connects the second daughtercard to the backplane, and the second daughtercard having the driver/receiver that receives the carried signal.

Various driver/receivers being used today can transmit signals at data rates between 5–10 Gb/sec and greater. The limiting factor (data transfer rate) in the signal path is the electrical connectors that connect each daughtercard to the backplane. Further, the receivers are capable of receiving signals having only 5% of the original signal strength sent by the driver. This reduction in signal strength increases the importance of minimizing cross-talk between signal paths to avoid signal degradation or errors being introduced into digital data streams. With high speed, high-density electrical connectors, it is even more important to eliminate or reduce cross-talk. Thus, a need exists in the art for a high-speed electrical connector capable of handling high-speed signals that reduces cross-talk between signal paths.

SUMMARY OF THE INVENTION

The present invention provides a high-speed electrical interconnection system designed to overcome the drawbacks of conventional interconnection systems. That is, the present invention provides an electrical connector capable of handling high-speed signals effectively.

In one aspect the present invention provides an interconnect system having a first circuit board, a second circuit board and a connector for connecting the first circuit board to the second circuit board.

The first circuit board includes (a) a first differential interconnect path, (b) a first signal pad on a surface of the first circuit board and (c) a second signal pad also on the surface of the first circuit board, wherein the first differential interconnect path includes a first signal path electrically connected to the first signal pad and a second signal path electrically connected to the second signal pad. The second circuit board includes a second differential interconnect path.

The connector electrically connects the first differential interconnect path with the second differential interconnect path. The connector may include the following: an interposer having a first face and a second face opposite the first face, the first face facing the surface of the first circuit board; a first conductor having an end adjacent to the second surface of the interposer; a second conductor parallel with and equal in length to the first conductor, the second conductor also having an end adjacent to the second surface of the interposer; a dielectric material disposed between the first conductor and the second conductor; a first elongated contact member having a conductor contact section, a board contact section and an interim section between the conductor contact section and the board contact section, the conductor contact section being in physical contact with the end of the first conductor, the board contact section being in physical contact with and pressing against a surface of the first signal pad, but not being secured to the first signal pad, and the interim section being disposed in a hole extending from the first face of the interposer to the second face of the interposer, wherein the first signal pad exerts a force on the first contact member and the first contact member is free to move in the direction of the force to a limited extent.

In another aspect, the present invention provides a connector for electrically connecting a signal path on a first circuit board with a signal path on a second circuit board. The connector may include: a first, a second and a third spacer; a first circuit board disposed between the first and second spacers; and a second circuit board disposed between the second and third spacers.

The first circuit board has a first face abutting a face of the first spacer and a second face abutting a face of the second spacer. The second face has a set of signal conductors disposed thereon. Each of the signal conductors disposed on the second face has a first end adjacent a first edge of the second face, a second end adjacent a second edge of the second face, and an interim section between the first end and the second end.

The second circuit board has a first face abutting a face of the second spacer and a second face abutting a face of the third spacer. The first face of the second circuit board having a set of signal conductors disposed thereon. Each of the signal conductors disposed on the first face having a first end adjacent a first edge of the first face, a second end adjacent a second edge of the first face, and an interim section between the first end and the second end.

The first edge of the second face of the first circuit board is parallel and spaced apart from the first edge of the first face of the second circuit board. Advantageously, to reduce cross-talk, none of the first ends of the signal conductors on the first circuit board are aligned with any of the first ends of the signal conductors on the second circuit board.

In another aspect, the present invention provides a spacer for a connector. The spacer may include a first face having a set of M grooves disposed thereon, each of the M grooves extending from a first edge of the first face to a second edge of the first face; a second face having a set of N grooves disposed thereon, each of the N grooves extending from a first edge of the second face to a second edge of the second face; and an elongate finger projecting outwardly from a side of the spacer for attaching the spacer to a part of the connector.

The above and other features, embodiments and advantages of the present invention, as well as the structure and operation of preferred embodiments of the present invention, are described in detail below with reference to the accompanying drawings.

BRIEF DESCRIPTION OF THE DRAWINGS

The accompanying drawings, which are incorporated herein and form part of the specification, help illustrate various embodiments of the present invention and, together with the description, further serve to explain the principles of the invention and to enable a person skilled in the pertinent art to make and use the invention. In the drawings, like reference numbers indicate identical or functionally similar elements. Additionally, the left-most digit(s) of a reference number identifies the drawing in which the reference number first appears.

DETAILED DESCRIPTION OF THE PREFERRED EMBODIMENT

Figure 1:
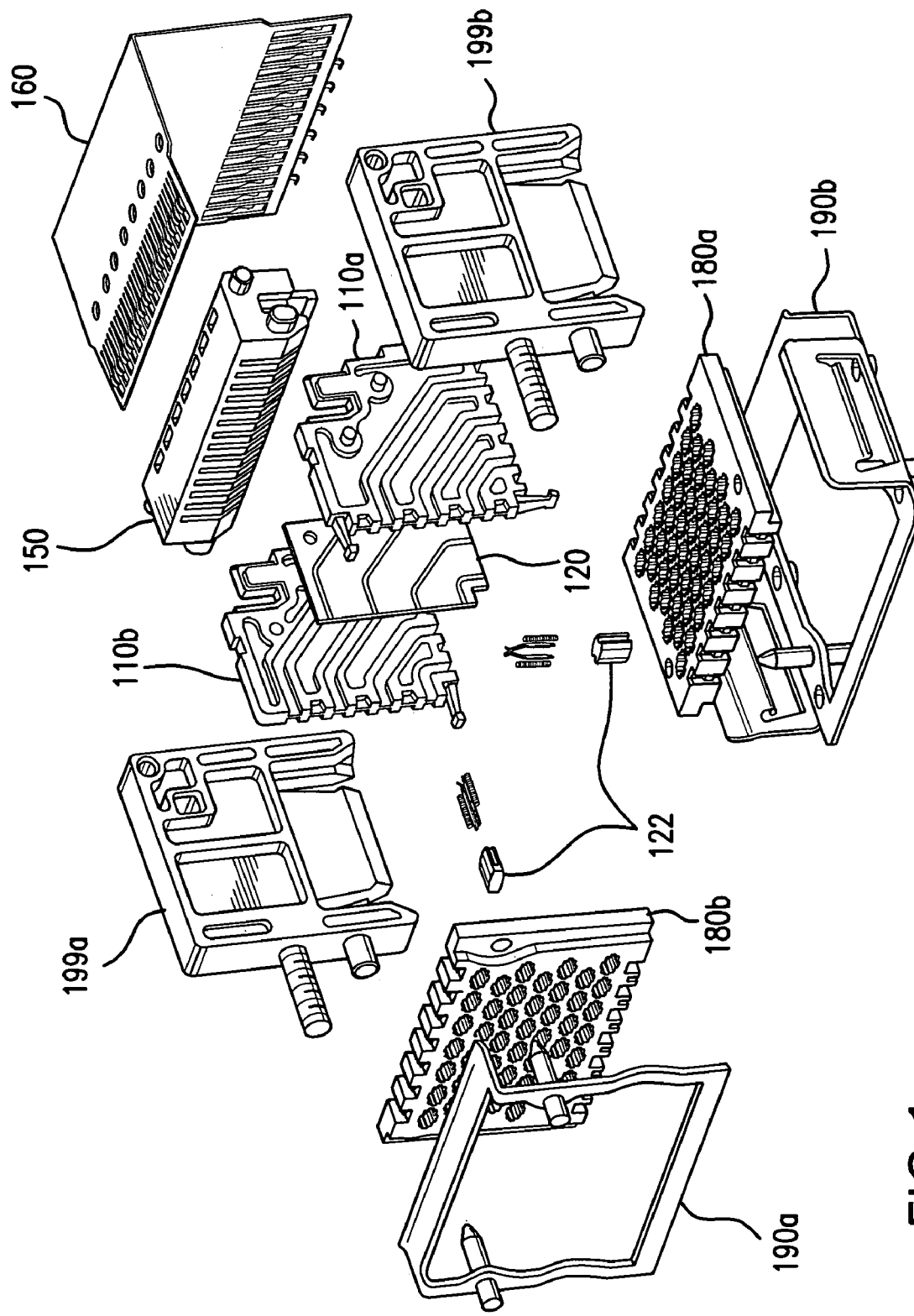
FIG. 1 is an exploded view of a connector in accordance with an example embodiment of the present invention.

FIG. 1 is an exploded view of a connector 100 in accordance with an example preferred embodiment of the present invention. Some elements have been omitted for the sake of clarity. As illustrated in FIG. 1, connector 100 may include at least one printed circuit board 120 having electrical conductors printed thereon. In the embodiment shown, connector 100 may further include a pair of spacers 110a and 110b, a pair of interposers 180a and 180b, a pair of end-caps 190a and 190b, a backbone 150, a shield 160, and a pair of endplates 190a and 190b. Although only one circuit board and only two spacers are shown in FIG. 1, one skilled in the art will appreciate that in typical configurations connector 100 will include a number of circuit boards and spacers, with each circuit board being disposed between two spacers, as will be described herein.

Figure 2:
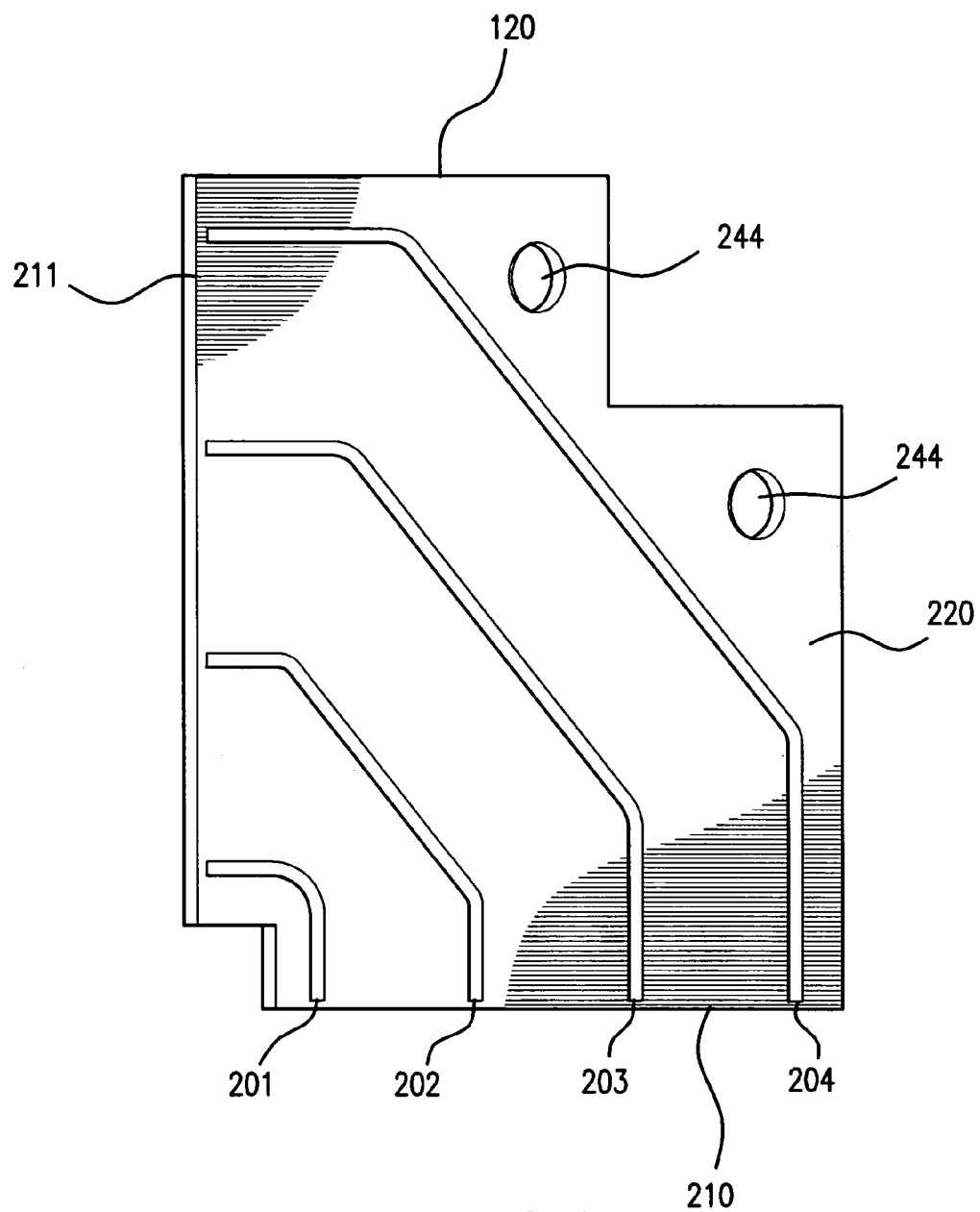
FIG. 2 is a view of a printed circuit board according to an embodiment of the present invention.

FIG. 2 is a view of printed circuit board 120. In the embodiment shown, circuit board 120 is generally rectangular in shape. As shown, circuit board 120 may have one or more electrical conductors disposed on a face 220 thereof. In the embodiment shown, board 120 has four conductors 201, 202, 203, and 204 disposed on face 220. Each conductor 201–204 has a first end, a second and an interim section between the first and second ends. The first end of each conductor is located at a point on or adjacent a first edge 210 of face 220 and the second end of each conductor is located at a point on or adjacent a second edge 211 of face 220. In many embodiments, second edge 211 of face 220 is perpendicular to first edge 210, as shown in the embodiment illustrated in FIG. 2.

Figure 3:
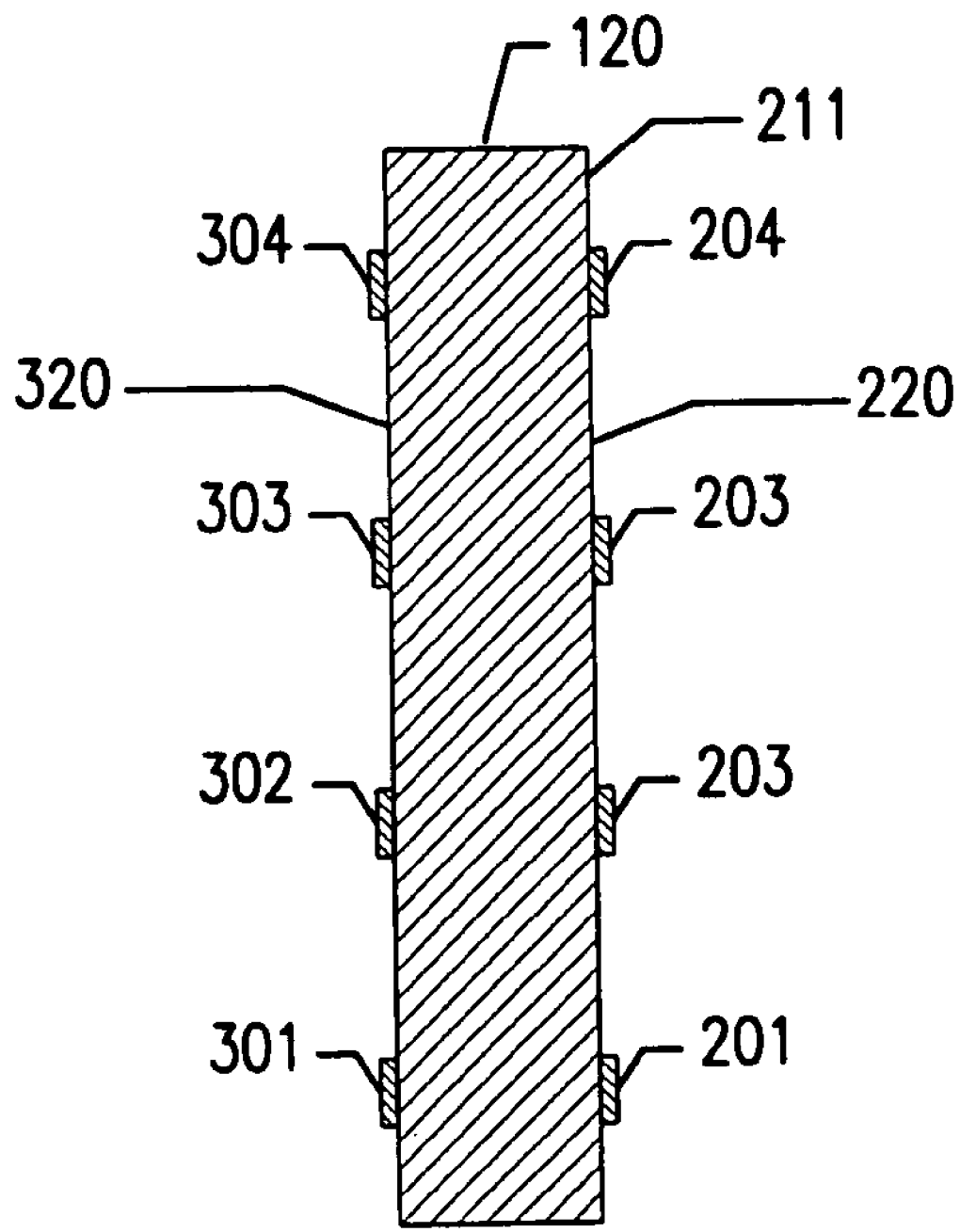
FIG. 3 is a front side view of the printed circuit board shown in FIG. 2.

Although not shown in FIG. 2, there are corresponding electrical conductors on the opposite face of circuit board 120. More specifically, for each conductor 201–204, there is a conductor on the opposite face that is a mirror image of the conductor. This feature is illustrated in FIG. 3, which is a front side view of board 120. As shown in FIG. 3, conductors 301–304 are disposed on face 320 of board 120, which face 320 faces in the opposite direction of face 220. As further illustrated, conductors 301–304 correspond to conductors 201–204, respectively.

When the interconnection system 100 of the present invention is used to transmit differential signals, one of the electrical conductors 201–204 and its corresponding electrical conductor on the opposite face may be utilized together to form the two wire balanced pair required for transmitting the differential signal. Since the length of the two electrical conductors is identical, there should be no skew between the two electrical conductors (skew being the difference in time that it takes for a signal to propagate the two electrical conductors).

In configurations where connector 100 includes multiple circuit boards 120, the circuit boards are preferably arranged in a row in parallel relationship. Preferably, in such a configuration, each circuit board 120 of connector 100 is positioned between two spacers 110.

Figure 4:
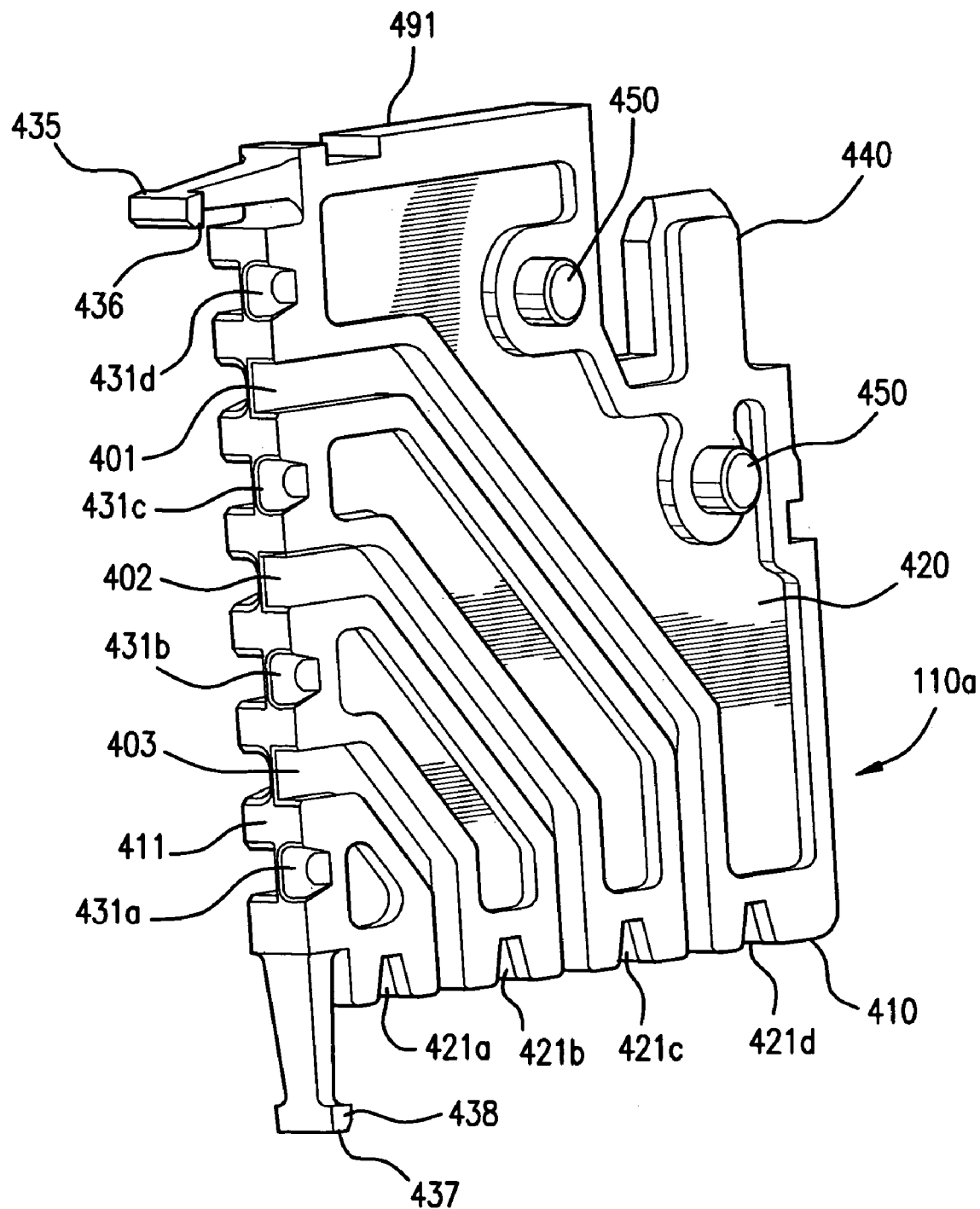
FIG. 4 is a perspective view of a spacer in accordance with an example embodiment of the present invention.

FIG. 4 is a perspective side view of spacer 110a according to one embodiment of the invention. As shown, spacer 110a may have one or more grooves disposed on a face 420 thereof, which face 420 faces away from board 120. In the embodiment shown, face 420 of spacer 110a has three grooves 401, 402 and 403 disposed thereon. Each groove 401–403 extends from a point at or near a first edge 410 of face 420 to a point at or near second edge 411 of face 420. In many embodiments, second edge 411 of face 420 is perpendicular to first edge 410, as shown in the embodiment illustrated in FIG. 4.

As further shown, face 420 of spacer 110a may have one or more recesses disposed at an edge of face 420. In the embodiment shown, there are two sets of four recesses disposed at an edge on face 420. The first set of recesses includes recesses 421a–d, and the second set of recesses includes recesses 431a–d. Each recess 421a–d is positioned directly adjacent to the end of at least one groove and extends from a point on edge 410 of face 420 to a second point spaced inwardly from edge 410 a short distance. Similarly, each recess 431a–d is positioned directly adjacent to the end of at least one groove and extends from a point on edge 411 of face 420 to a second point spaced inwardly from edge 411 a short distance. Accordingly, in the embodiment shown, there is at least one recess between the ends of all the grooves. Each recess 421, 431 is designed to receive the end of spring element (see FIG. 16, elements 1520).

Figure 6:
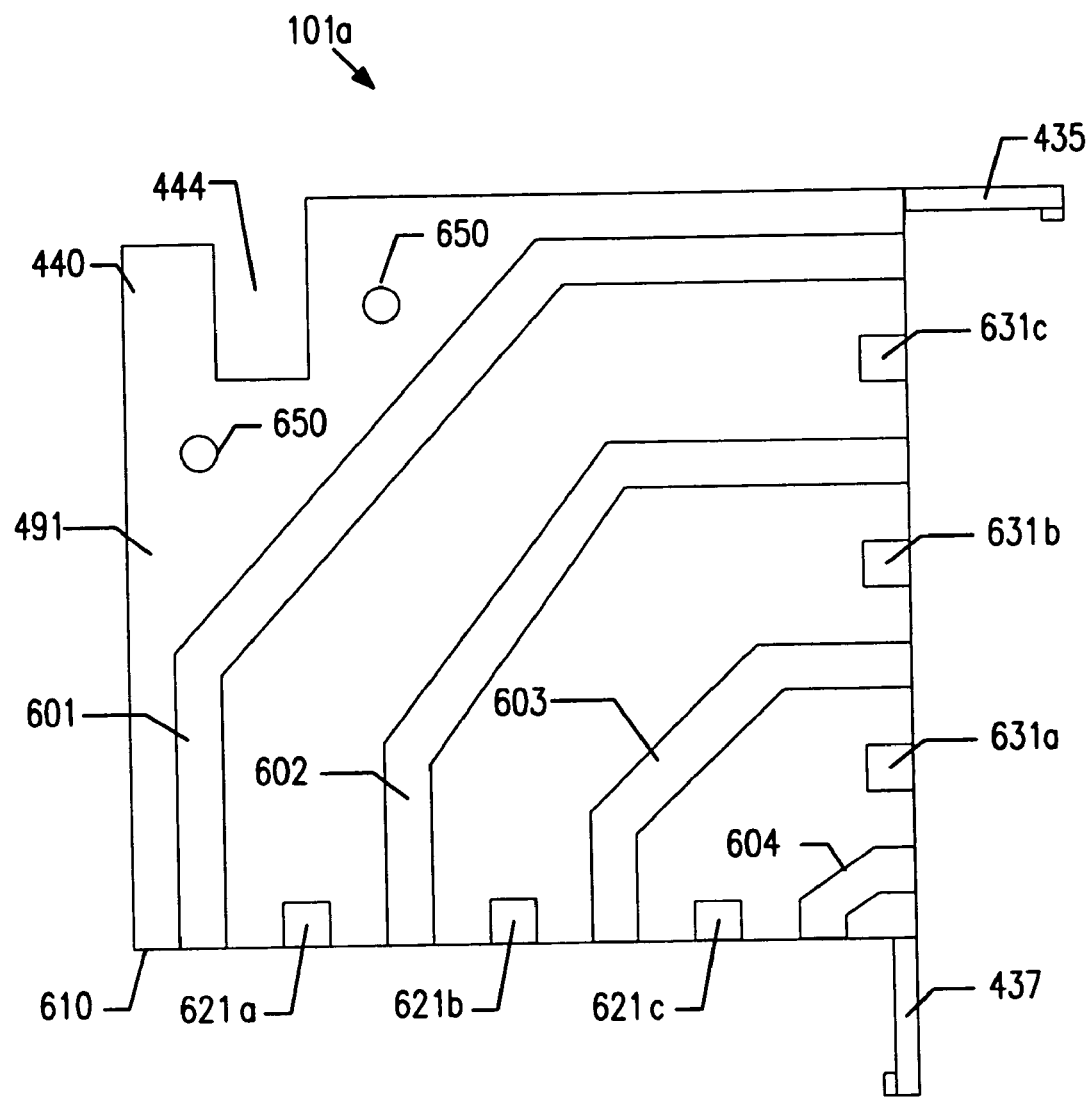
FIG. 6 is a top view of a second face of the spacer shown in FIG. 4.
Figure 7:
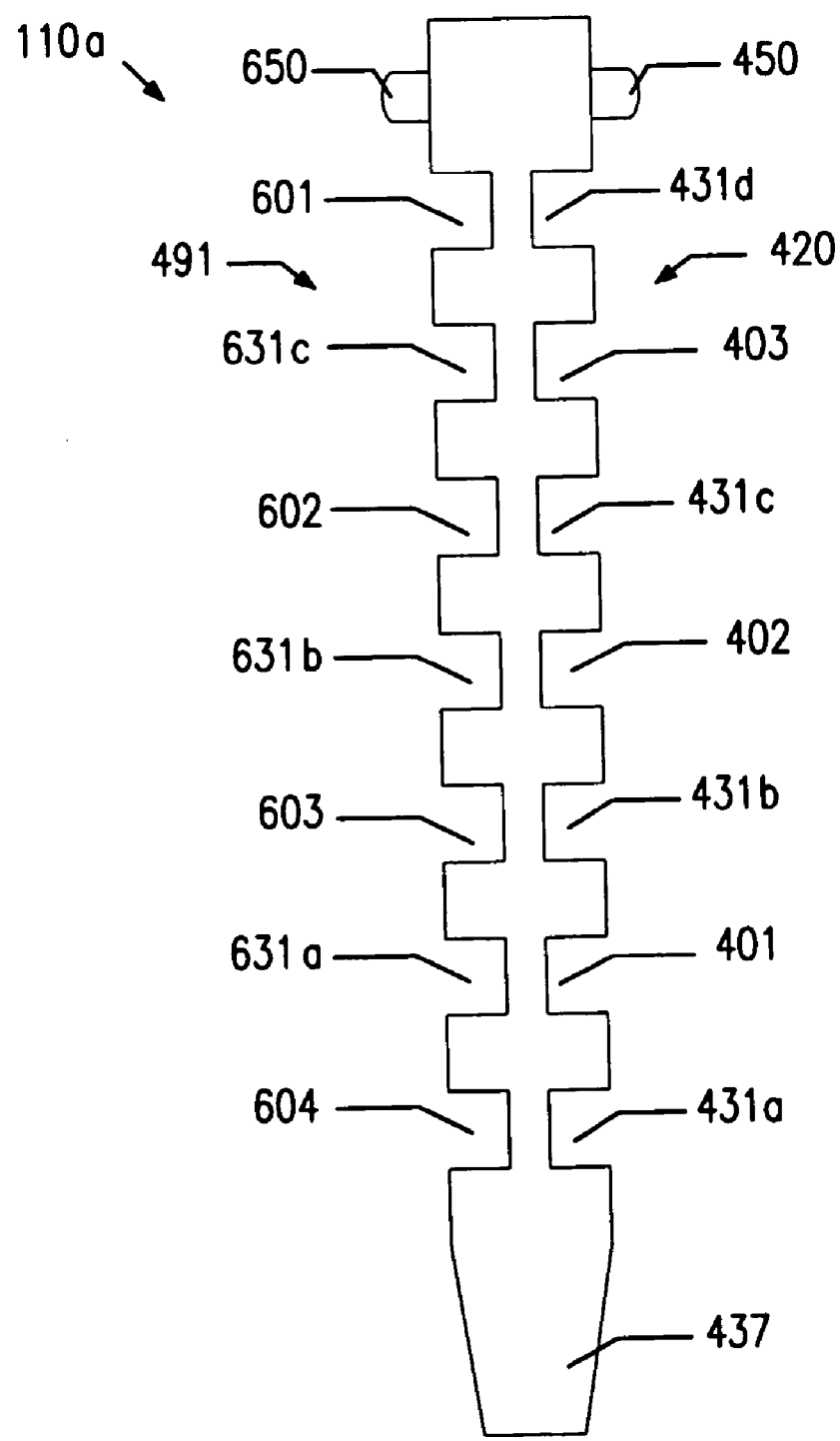
FIG. 7 is a front side view of the spacer shown in FIG. 4.

Although not shown in FIG. 4, there may be grooves and recesses on the opposite face 491 of spacer 110a. In a preferred embodiment, the number of grooves on the first face of a spacer 110 is one less (or one more) than the number of grooves on the second face of the spacer 110, but this is not a requirement. Similarly, in the preferred embodiment, the number of recesses on the first face of a spacer 110 is two less (or two more) than the number of recesses on the second face of the spacer 110. This feature is illustrated in FIGS. 5–7, where FIG. 5 is a top view of face 420, FIG. 6 is a top view of the opposite face (i.e., face 491), and FIG. 7 is a front side view of spacer 110a.

Figure 5:
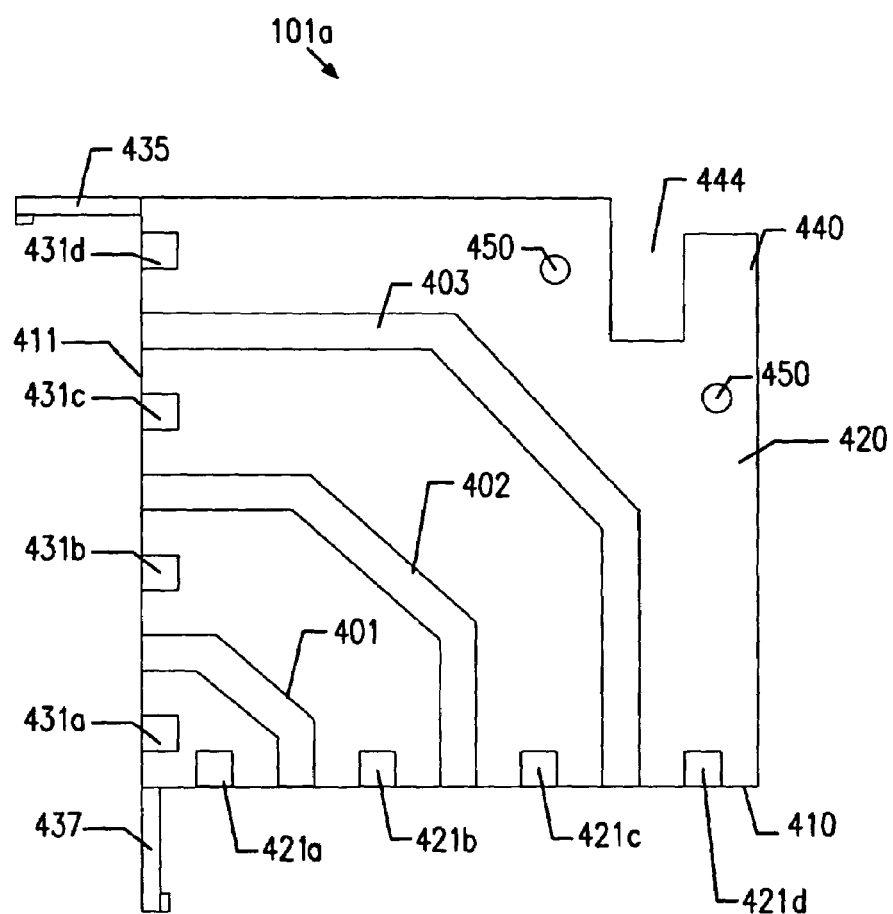
FIG. 5 is a top view of a first face of the spacer shown in FIG. 4.

As shown in FIG. 5, grooves 401–403, recesses 421a–d, and recesses 431a–d are disposed on face 420 of spacer 110a. Similarly, as shown in FIG. 6, grooves 601–604, recesses 621a–c, and recesses 631a–c are disposed on face 491 of spacer 110a, which face 491 faces in the opposite direction of face 420.

Grooves 601–604 are similar to grooves 401–404 in that each groove 601–604 extends from a point on a first edge 610 of face 491 to a point on a second edge 611 of face 491. Likewise, recesses 621 and 631 are similar to recesses 421 and 431. Like each recess 421, each recess 621 extends from a point on edge 610 of face 491 to a second point spaced inwardly from edge 610 a short distance. Similarly, each recess 631 extends from a point on edge 611 of face 491 to a second point spaced inwardly from edge 611 a short distance. Each recess 621, 631 is designed to receive the end of a spring element (see FIG. 16, elements 1520).

The figures illustrate that, in some embodiments, the number of grooves on one face of a spacer 110 is one less (or one more) than the number of grooves on the opposite face of the spacer. And also show that the number of recesses on one face may be two less (or two more) than the number of recesses on the opposite face.

In the embodiment shown in FIGS. 4–6, each recess on one face is positioned so that it is generally directly opposite an end of a groove on the other face. For example, recess 421a is generally directly opposite an end of groove 604 and recess 621a is generally directly opposite an end of groove 403. This feature can be more easily seen by examining FIG. 7, which is a front side view of the spacer.

Referring back to FIG. 4–6, FIG. 4 shows that spacer 110a may further include three fingers 435, 437, and 440. It also shows that that spacer 110a may also include a slot 444 and a first pair of bosses 450 disposed on and projecting outwardly from face 420 and a second pair of bosses 650 disposed on and projecting outwardly from face 491. Bosses 650 are provided to fit in the apertures 244 of circuit board 120. This feature enables board 120 to be properly aligned with respect to the adjacent spacers 110a and 110b.

Finger 435 is located towards the top of the front side of spacer 110a and finger 437 is located towards the front of the bottom side of spacer 110a. Finger 435 projects outwardly from the front side of spacer 110a in a direction that is perpendicular to the front side of the spacer. Similarly, finger 437 projects outwardly from the bottom side of spacer 110a in a direction that is perpendicular to the bottom side of the spacer. Fingers 435, 437 function to attach spacer 110a to interposers 180b, 180a, respectively. More specifically, interposer 180a includes a recess 1810 (see FIG. 18) for receiving and retaining finger 437. Similarly interposer 180b includes a recess for receiving and retaining finger 435. Fingers 435, 437 each include a protrusion 436 and 438, respectively. The protrusions are sufficiently resilient to allow them to snap into corresponding recesses in the corresponding interposers.

Slot 444 is located towards but spaced apart from the backside of spacer 110a. Slot 444 extends downwardly from the top side of spacer 110 to form finger 440. Finger 440 and slot 444 function together to attach spacer 110a to backbone 150.

Figure 8:
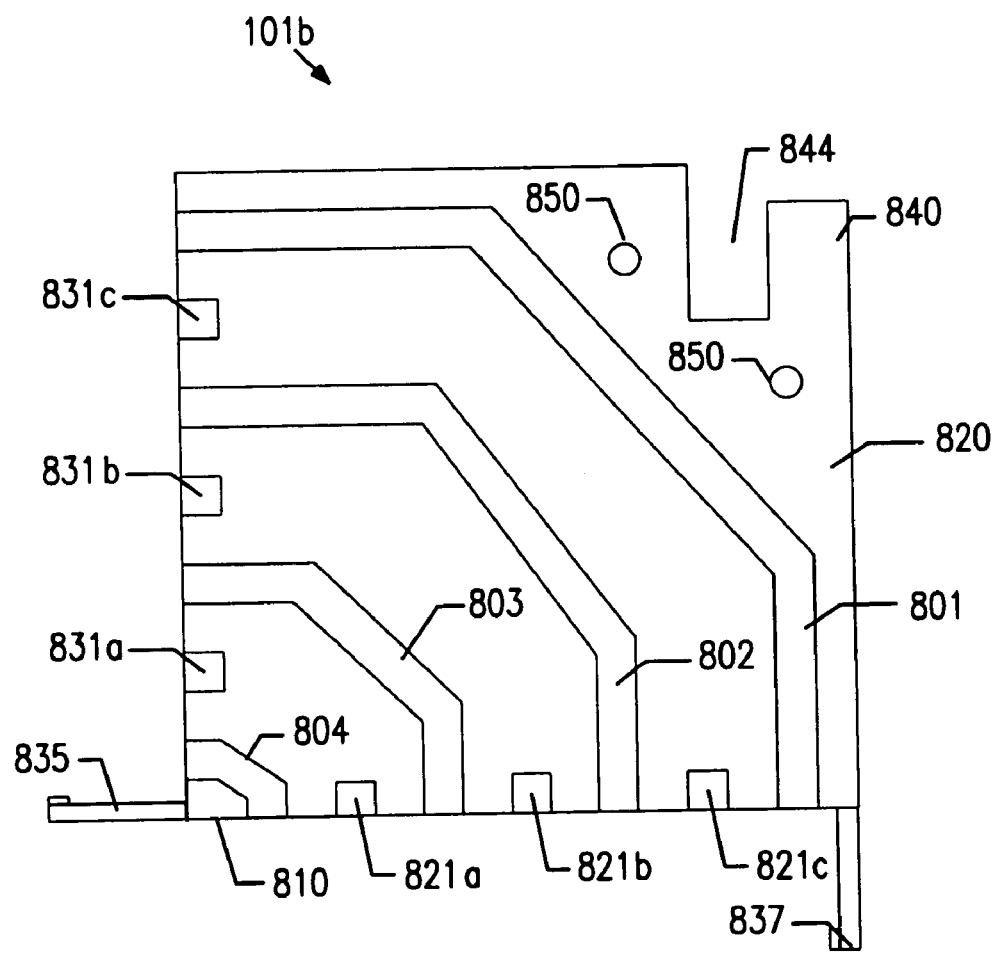
FIG. 8 is a top view of a first face of a second spacer.
Figure 9:
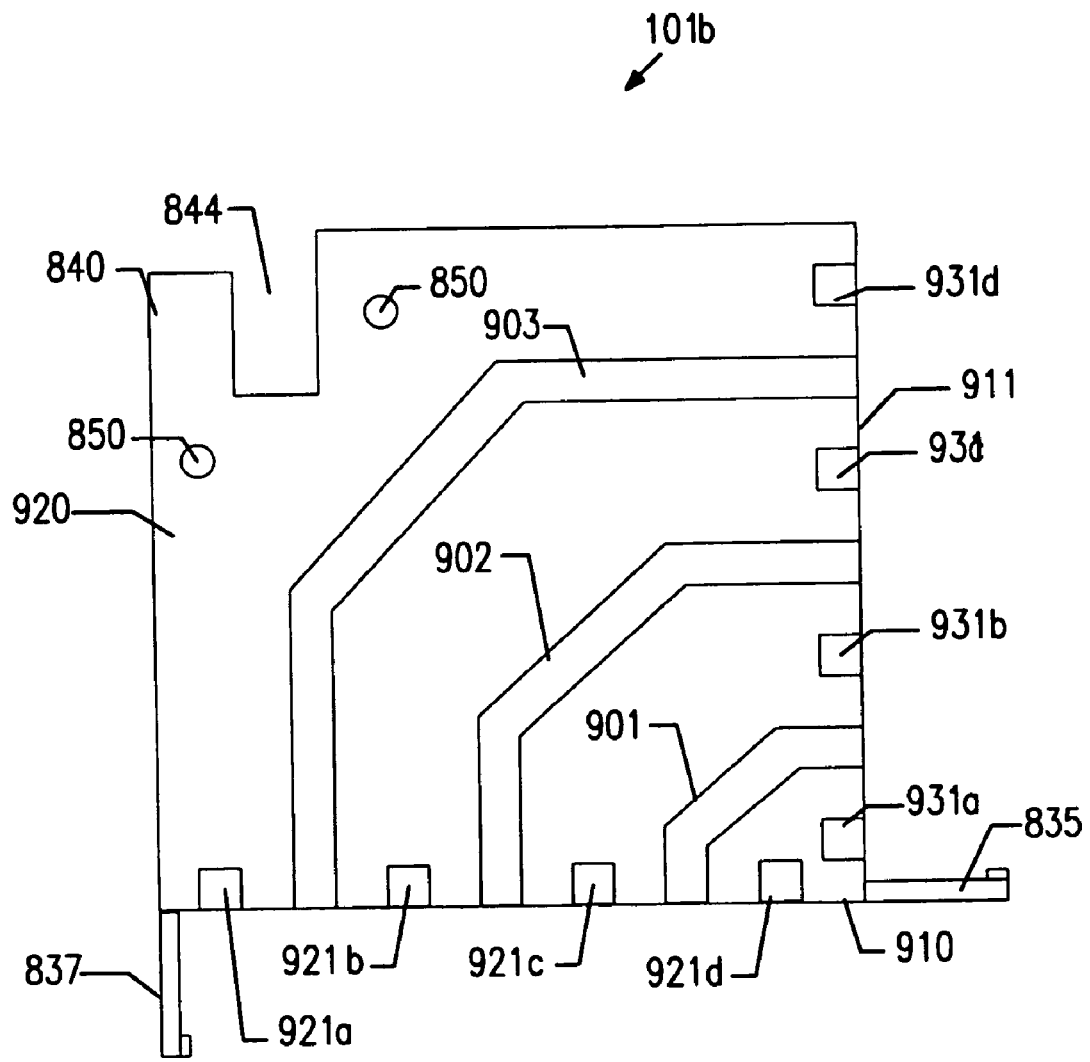
FIG. 9 is a top view of a second face of the second spacer.

Referring back to spacer 100b (see FIG. 1), in the embodiment shown, spacer 110b is similar but not identical to spacer 110a. Accordingly, in some embodiments connector 100 includes two types of spacers: type A and type B. In other embodiments, more or less than two types of spacers may be used. FIGS. 8 and 9 further illustrate spacer 110b (the type B spacer) according to one embodiment. FIG. 8 is a top view of a face 820 of spacer 110b. Face 820 faces circuit board 120. As shown in FIG. 8, face 820 is similar to face 491 of spacer 110a, which also faces board 120. Like face 491, face 820 has four grooves 801–804, a first set of three recesses 821a–c, and a second set of three recesses 831a–c.

Grooves 801–804 are similar to grooves 601–604 in that each groove 801–804 extends from a point on a first edge 810 of face 820 to a point on a second edge 811 of face 820. Likewise, recesses 821 and 831 are similar to recesses 621 and 631. Like each recess 621, each recess 821 extends from a point on edge 810 of face 820 to a second point spaced inwardly from edge 810 a short distance. Similarly, each recess 831 extends from a point on edge 811 of face 820 to a second point spaced inwardly from edge 811 a short distance.

FIG. 9 is a top view of a face 920 of spacer 110b. Face 920 faces away from circuit board 120 in the opposite direction of face 820. As shown in FIG. 9, face 920 is similar to face 420 of spacer 110a, which also faces away from board 120. Like face 420, face 920 has three grooves 901–903, a first set of four recesses 921a–d, and a second set of four recesses 931a–d.

Grooves 901–903 are similar to grooves 401–403 in that each groove 901–903 extends from a point on a first edge 910 of face 920 to a point on a second edge 911 of face 920. Likewise, recesses 921 and 931 are similar to recesses 421 and 431. Each recess 421 extends from a point on edge 910 of face 920 to a second point spaced inwardly from edge 910 a short distance, and each recess 931 extends from a point on edge 911 of face 920 to a second point spaced inwardly from edge 911 a short distance.

Spacer 110b also includes three fingers 835, 837, and 840, a slot 844, and a pair apertures 850 extending through spacer 110b. Apertures 850 are provided to receive bosses 650. This feature enables spacer 110b to be properly aligned with respect to spacers 110a.

Unlike finger 435, which is located towards the top of the front side of spacer 110a, finger 835 is located towards the bottom of the front side of spacer 110b. Similarly, unlike finger 437, which is located towards the front of the bottom side of spacer 110a, finger 837 is located towards the back of the bottom side of spacer 110b. Finger 835 projects outwardly from the front side of spacer 110a in a direction that is perpendicular to the front side of the spacer, and finger 437 projects outwardly from the bottom side of spacer 110a in a direction that is perpendicular to the bottom side of the spacer. Like fingers 435, 437, fingers 835, 837 function to attach spacer 110b to interposers 180b, 180a, respectively.

Figure 10:
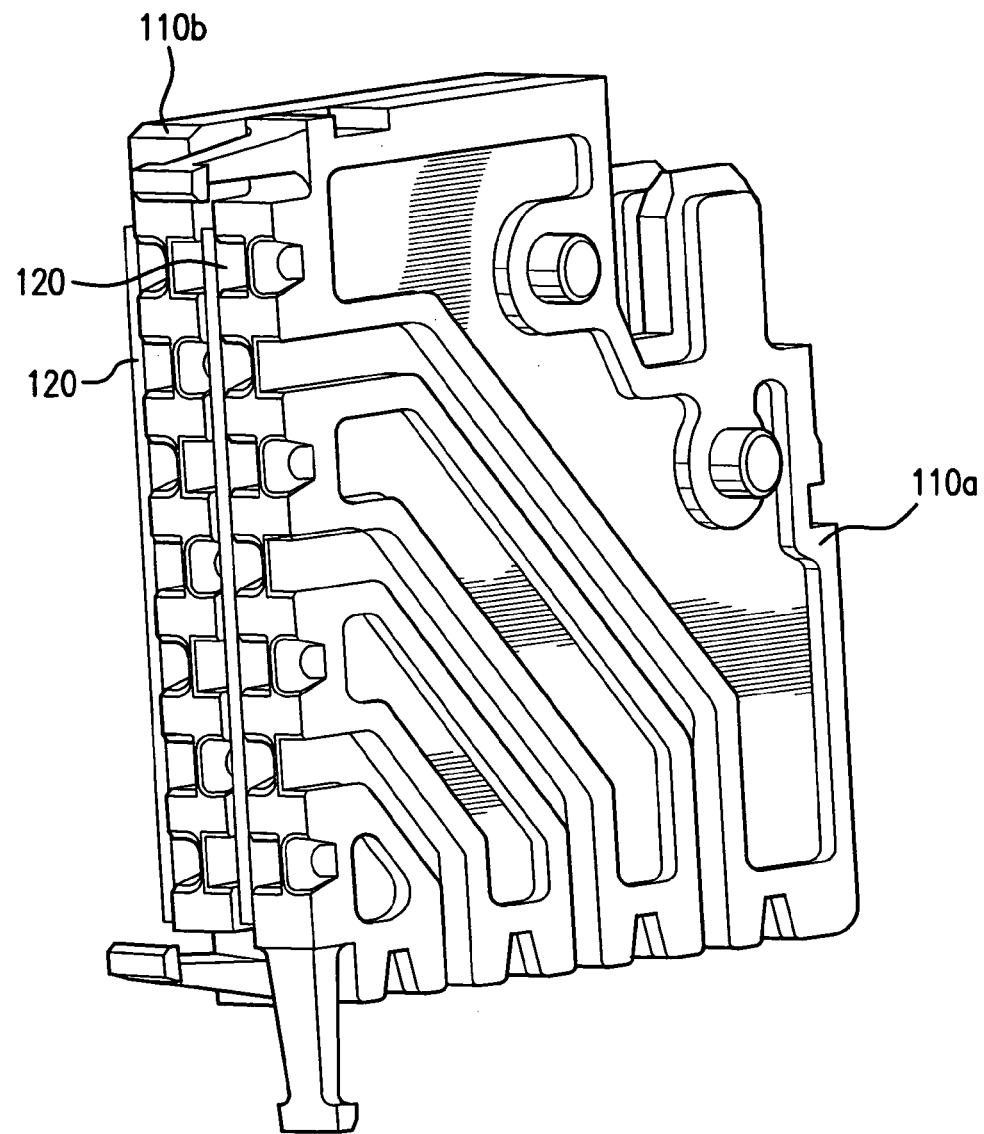
FIG. 10 is a perspective view of an apparatus consisting of a circuit board sandwiched between two spacers.

As discussed above, board 120 is positioned between spacers 110a and 110b. This feature is illustrated in FIG. 10. Although not shown in FIG. 10, bosses 650 of spacer 110a protrude though apertures 244 of board 120 and through apertures 850 of spacer 110b. This use of bosses 650 facilitates the proper alignment of spacers 110a,b and board 120. When board 120 is properly aligned with the spacers, conductors 201–204 and 301–304 are aligned with grooves 601–604 and 801–804, respectively. This feature is illustrated in FIG. 11.

Figure 11:
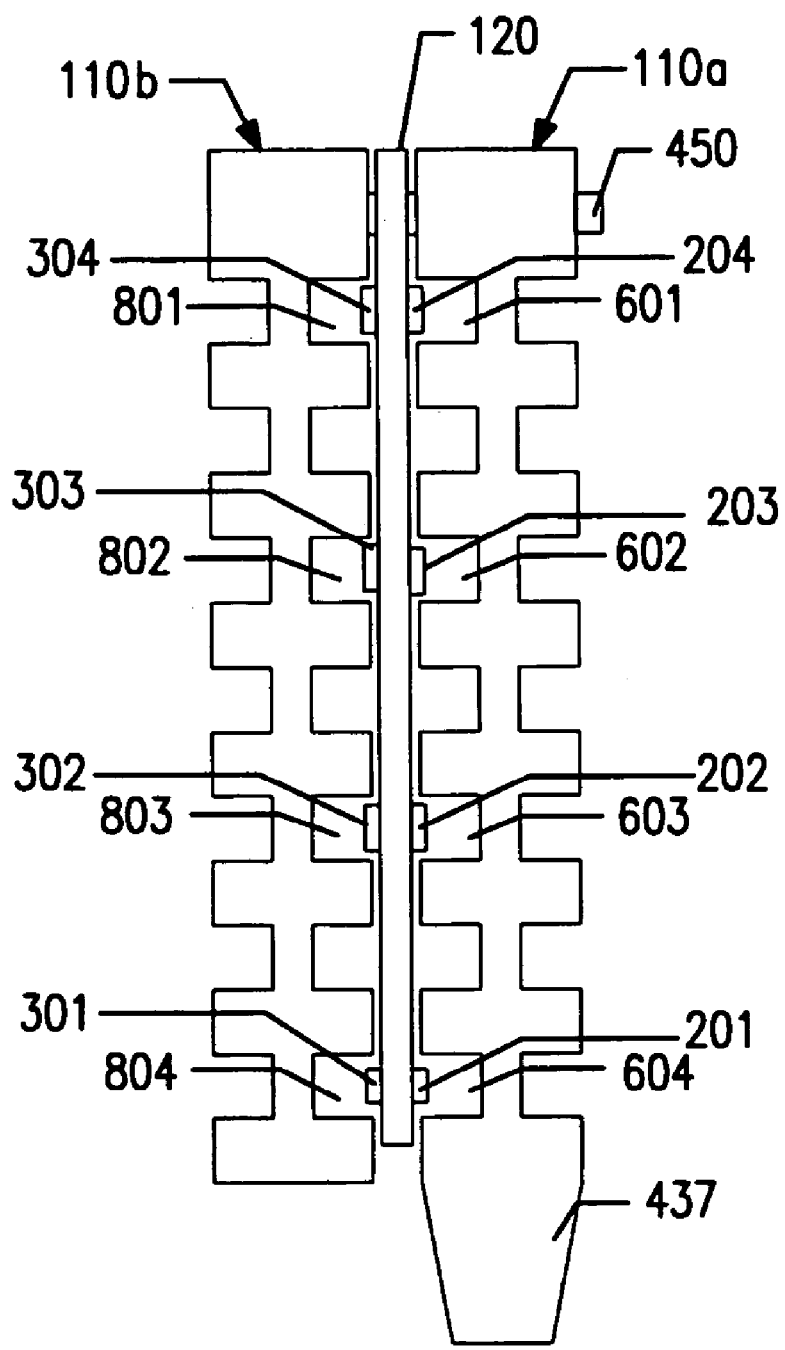
FIG. 11 is a front side view of the apparatus shown in FIG. 10.

As shown in FIG. 11, grooves 601–604, which are disposed on the side of spacer 110a facing board 120, are positioned on the spacer to mirror electrical conductors 201–204 on printed circuit board 120. Likewise, grooves 801–804, which are disposed on the side of spacer 110b facing board 120, are positioned on the spacer to mirror electrical conductors 301–304. Grooves 601–604 and 801–804, among other things, prevent electrical conductors 201–204 and 301–304 from touching spacer 110a and 110b, respectively. In this way, the electrical conductors disposed on board 120 are insulated by the air caught between board 120 and the grooves.

Spacers 110 may be fabricated either from an electrically conductive material or from a dielectric material and coated with an electrically conductive layer to electromagnetically shield the electrical conductors of the printed circuit board 120. Furthermore, the complex impedances of the electrical conductors and their associated grooves can be adjusted by varying the dimensions thereof. Still furthermore, the grooves can include a layer of a dielectric material, such as Teflon, to further adjust the complex impedances of the electrical conductors and their associated channels as well as adjusting the breakdown voltage thereof.

Figure 12:
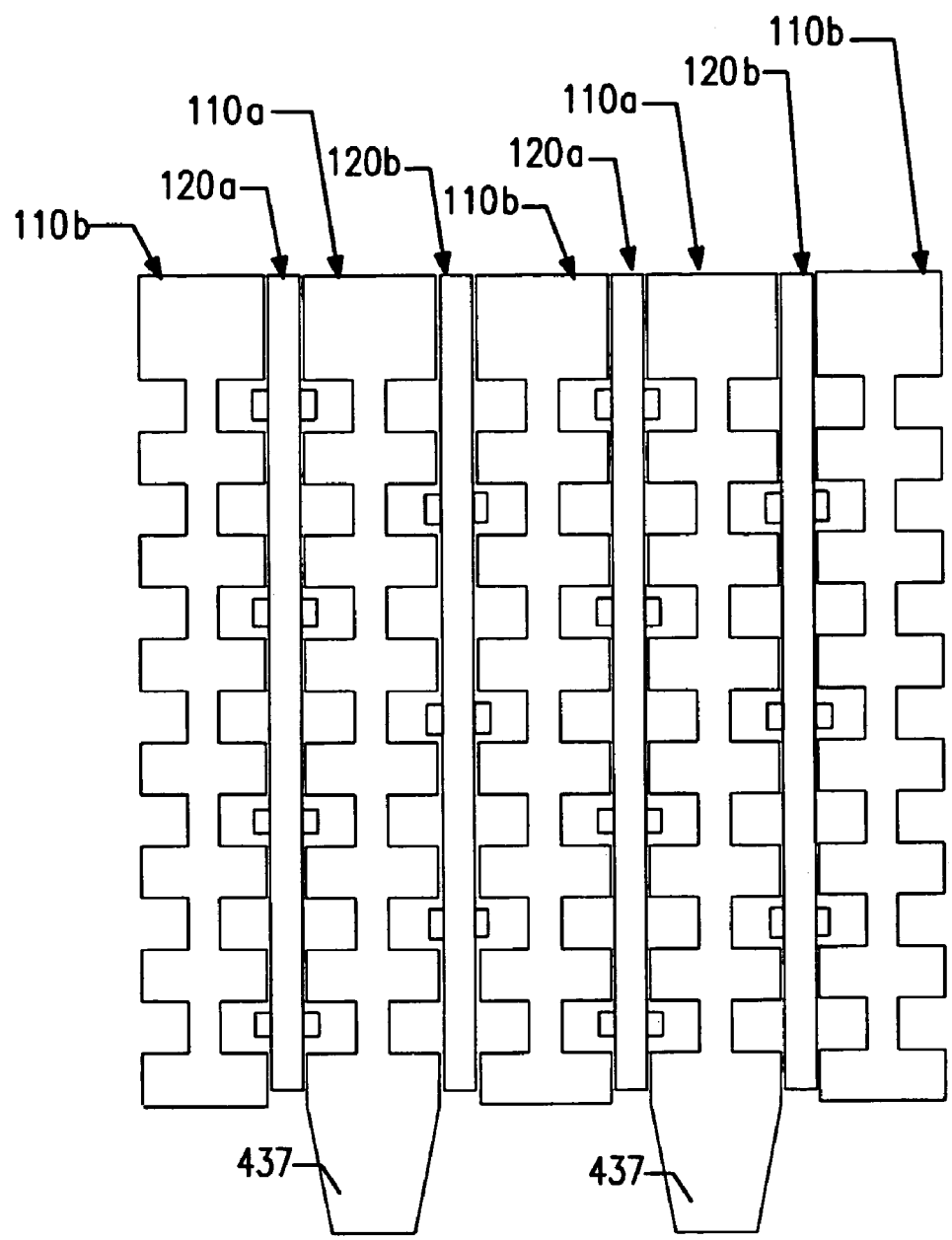
FIG. 12 illustrates an arrangement of multiple circuit boards and multiple spacers according to an example embodiment of the present invention.

Referring now to FIG. 12, FIG. 12 illustrates an example arrangement of spacers 110 and circuit boards 120 when multiple circuit boards are used in connector 100. As shown, boards 120 and spacers 110 are aligned in a row in parallel relationship and each circuit board 120 is sandwiched between two spacers 110. In the example shown, there are two types of circuit boards (A) and (B), as well as the two types of spacers (A) and (B) discussed above. The A type circuit boards are identical to each other and the B type circuit boards are identical to each other. Similarly, The A type spacers are identical to each other and the B type spacers are identical to each other.

In the embodiment shown, spacers 110 and boards 120 are arranged in an alternating sequence, which means that between any two given A type spacers there is a B type spacer and vice-versa, and between any two given A type boards there is a B type board and vice-versa. Thus, an A type spacer is not adjacent to another A type spacer and an A type board is not adjacent to another A type board. Accordingly, in this example configuration, each board 120 is disposed between an A type spacer and a B type spacer.

Figure 13:
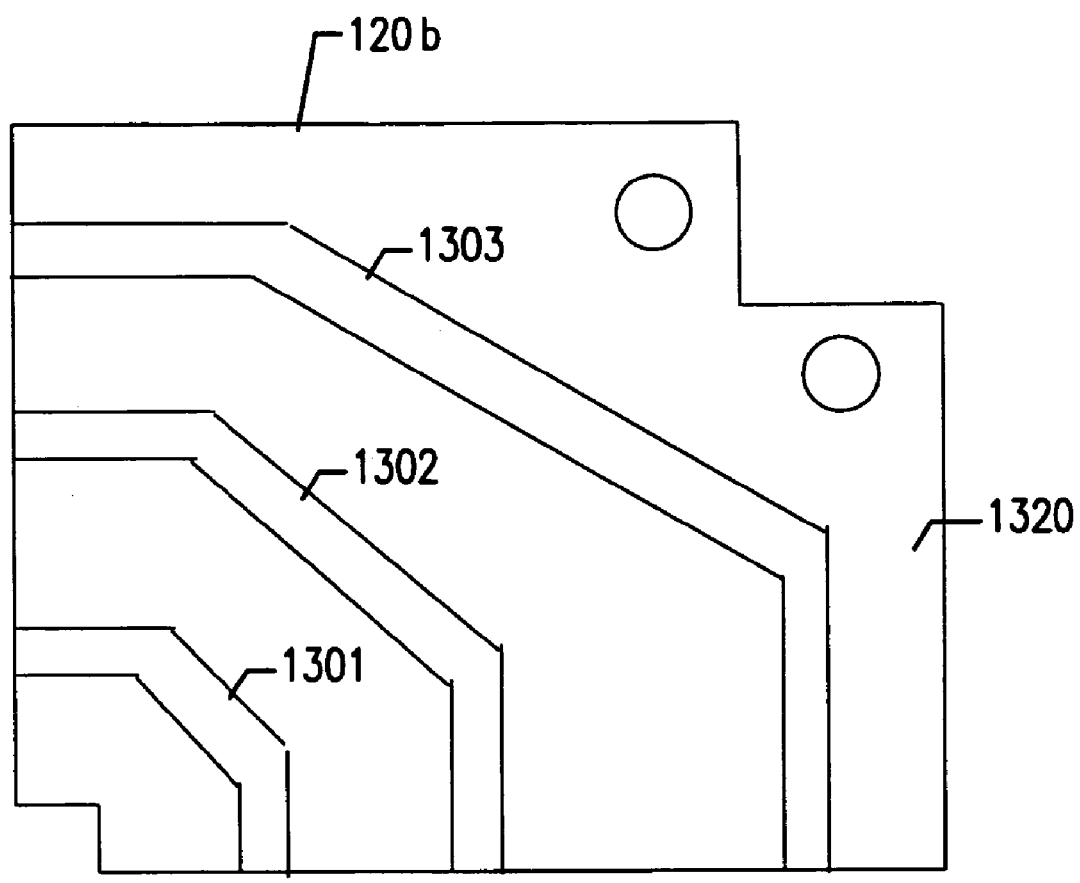
FIG. 13 is a top view of a first face of a circuit board according to an embodiment of the present invention.

As can be seen from FIG. 12, each face of each board 120b (the B type board) has three conductors thereon. FIG. 13 is a top view of one face 1320 of a B type board (the other face not shown is a mirror image of face 1320). As shown in FIG. 13, there are three conductors 1301, 1302, and 1303 disposed on face 1320. By comparing FIG. 13 to FIG. 2 (which is a top view of a face of an A type board), one can see that the A and B type boards are nearly identical. One difference being the number of conductors on each face and the alignment of the conductors on the face. In the embodiment shown, the B type boards have one less electrical conductor than do the A type boards.

Figure 14:
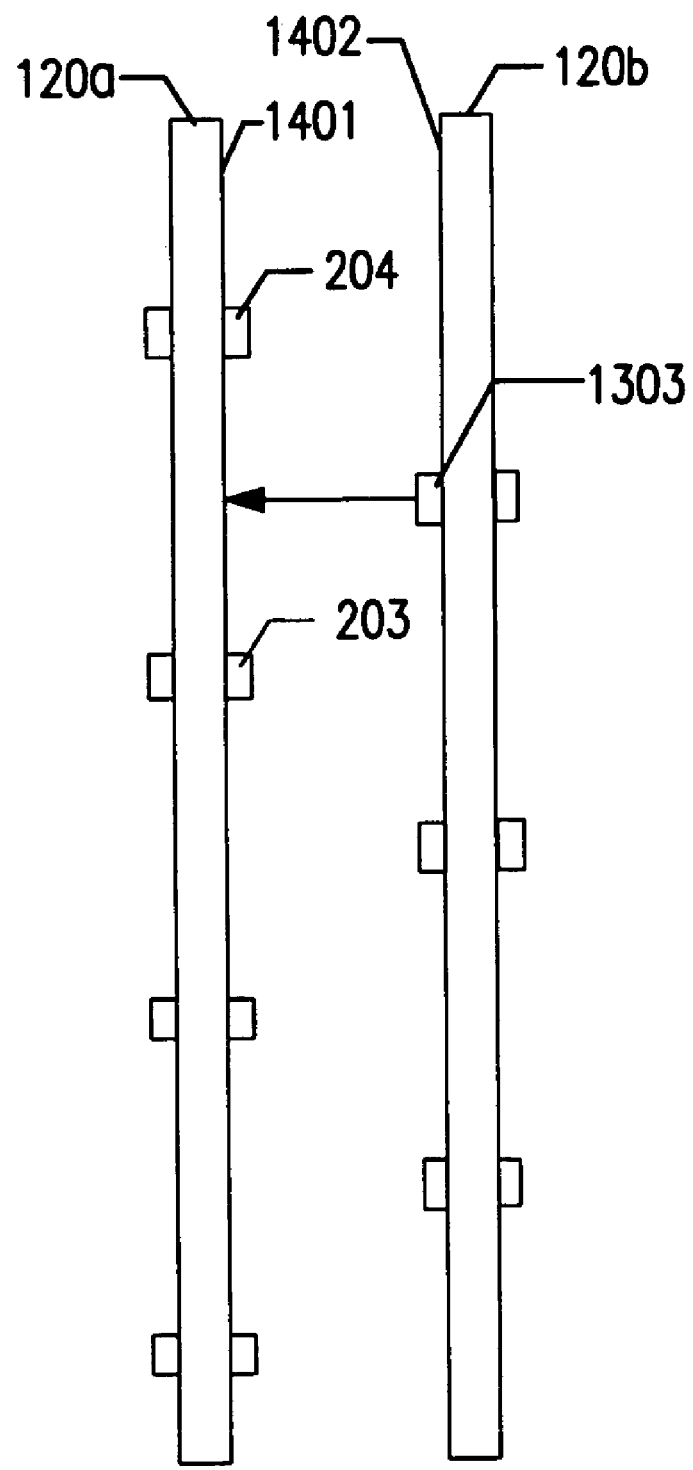
FIG. 14 illustrates how the alignment of the conductors on an A type circuit board differs from alignment of the conductors on a B type circuit board.

Referring to FIG. 14, FIG. 14 illustrates how the alignment of the conductors 1301–1303 on the B type boards differs from alignment of the conductors 201–204 on the A type boards. FIG. 14 shows representative boards 120a and 120b in a side by side arrangement so that a front edge 1401 on board 120a is spaced apart from and parallel with a corresponding front edge 1402 on board 120b. From FIG. 14, one can clearly see that the ends of the conductors on the B type board located at edge 1402 are not aligned with the ends of the conductors on the A type board located at edge 1401. For example, in the example shown, the end of any given conductor on the B type board is interstitially aligned with respect to the ends of two adjacent conductors on the A type board. That is, if one were to draw the shortest line from the end of each conductor on the B board to the adjacent face of the A board, each line would terminate at a point that is between the ends of two conductors on the A board. For example, the shortest line from the end of conductor 1301 to the adjacent face of board 120a ends at a point that is between the ends of conductors 204 and 203. An advantage of having the conductors be misaligned is that it may reduce cross-talk in the connector.

Referring back to FIG. 12, one can clearly see that each conductor on each board 120 is aligned with a groove on the spacer directly adjacent the conductor. That is, each groove on each spacer 110 is designed to mirror a corresponding conductor on an adjacent board 120. Because each conductor is aligned with a corresponding groove, there is a space between the conductor and the spacer.

When connector 100 is fully assembled, each conductor on a board 120 comes into physical and electrical contact with two contact members (see FIG. 15 for a representative contact member 1530a), an end of each of which fits into the space between the adjacent spacer and the conductor. More specifically, the first end of each conductor comes into physical and electrical contact with the contact portion of a first contact member and the second end of each conductor comes into physical and electrical contact with the contact portion second contact member, and the contact portions of the first and second contact members are each disposed in the space between the corresponding end of the conductor and the spacer. Each contact member functions to electrically connect the conductor to which it makes contact to a trace on a circuit board to which the connector 100 is attached.

Figure 15:
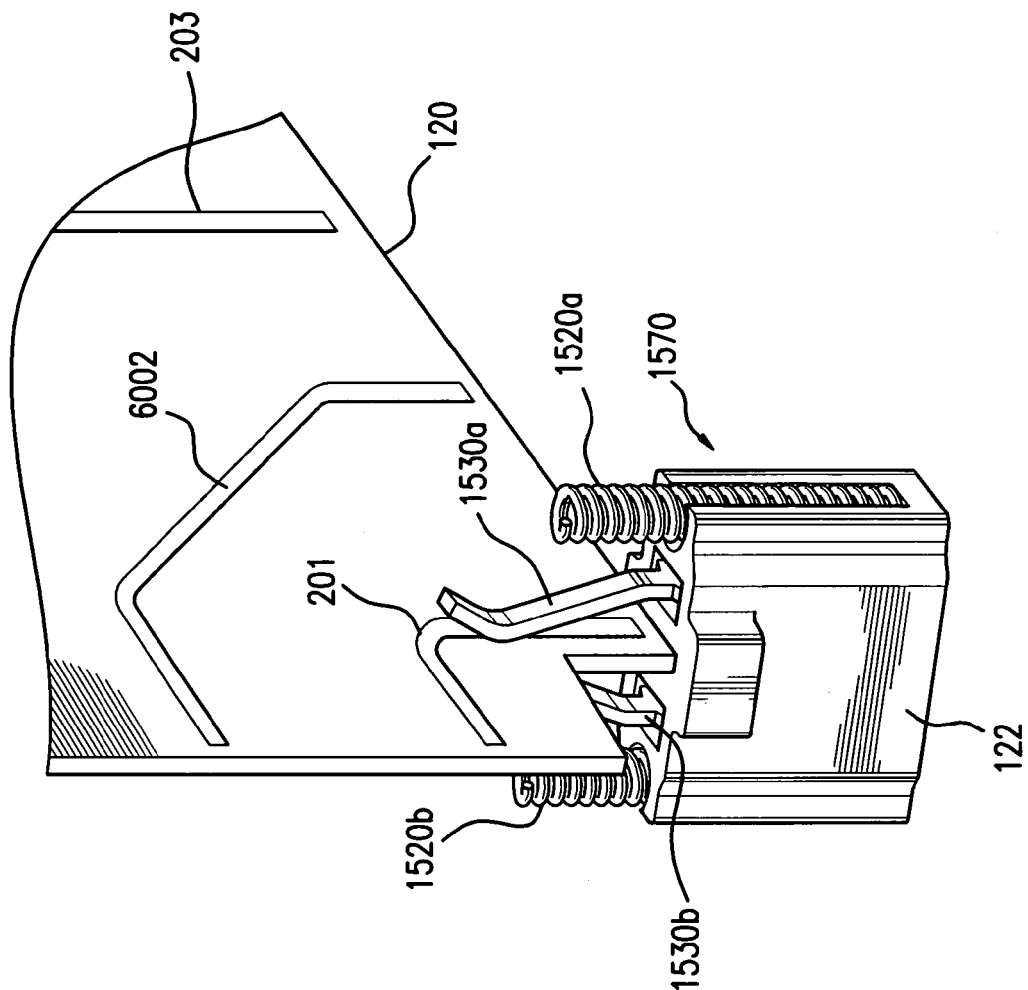
FIG. 15 illustrates a contact member according to one embodiment of the invention.

FIG. 15 illustrates a contact member 1530a, according to one embodiment of the invention, for electrically connecting a conductor 201 on a board 120 to trace on a circuit board (not shown in FIG. 15) to which the connector 100 is attached. Only a portion of contact member 1530a is visible in FIG. 15 because a portion is disposed within a housing 122.

As shown in FIG. 15, contact member 1530a contacts an end of conductor 201 (the spacers and interposers are not shown to better illustrate this feature). In some embodiments, the ends of the conductor 201 are wider than the interim portions so as to provide more surface area for receiving the contact portion of the contact members.

Partially shown in FIG. 15 is another contact member 1530b. Contact member 1530b has a bottom portion that is also housed in housing 122. Contact member 1530b contacts an end of conductor 301, which can't be seen in FIG. 15. Housing 122 is preferably fabricated of an electrically insulative material, such as a plastic. The electrical contacts 1530 of each housing 122 can either be disposed within the housing during fabrication or subsequently fitted within the housing.

Contact members 1530 may be fabricated by commonly available techniques utilizing any material having suitable electrical and mechanical characteristics. They may be fabricated of laminated materials such as gold plated phosphor bronze. While they are illustrated as being of unitary construction, one skilled in the art will appreciate that they may be made from multiple components.

As further shown in FIG. 15, housing 122 may be configured to hold two elongate springs 1520a and 1520b. Springs 1520 extend in the same direction as contact members 1530 and 1531. The distal end of a spring 1520 is designed to be inserted into a corresponding spacer recess. For example, distal end of spring 1520a is designed to be received in recess 621c. The combination of the housing 122, contact members 1530, and springs 1520 is referred to as a cell 1570.

Figure 16:
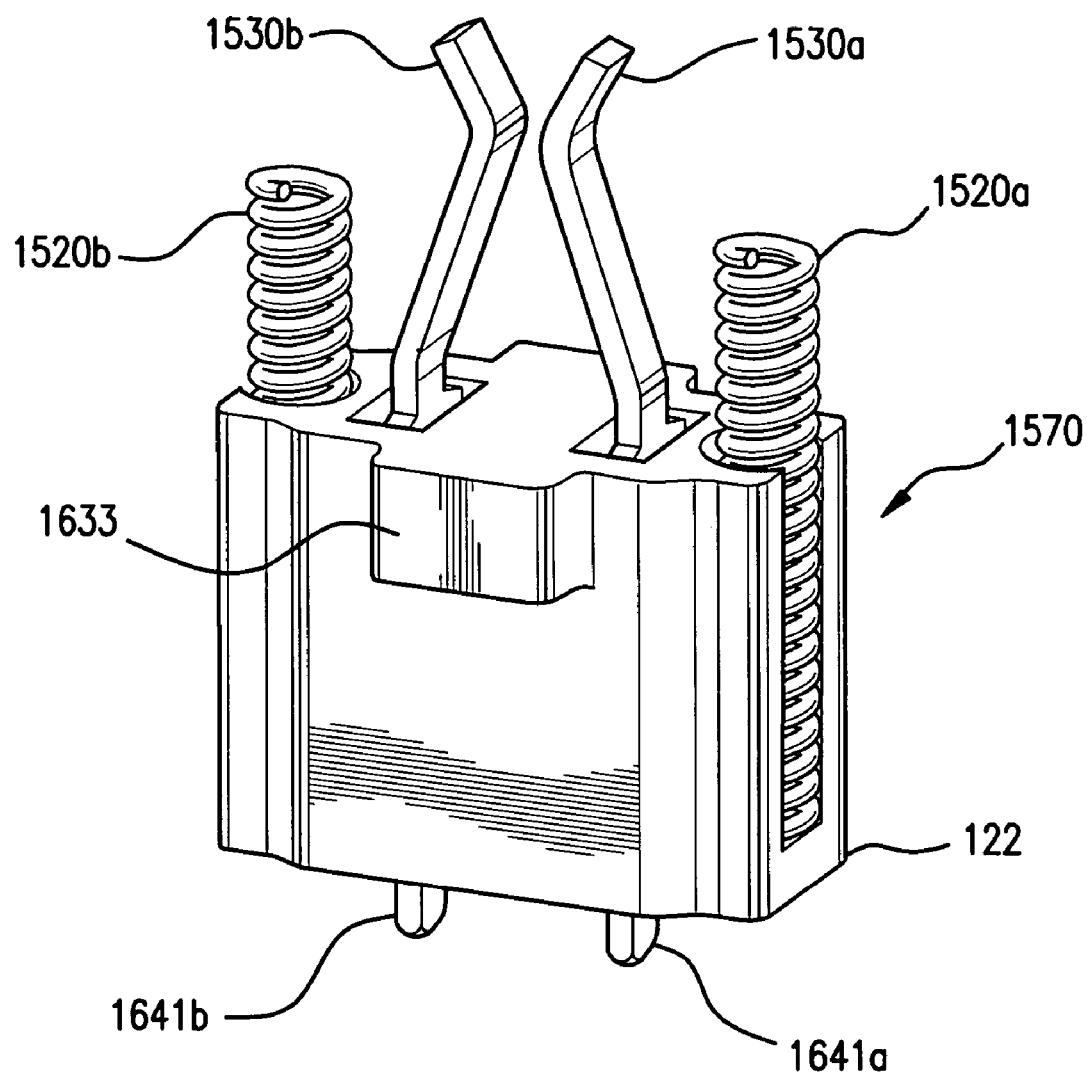
FIGS. 16 and 17 illustrate a cell according to one embodiment of the invention.
Figure 17:
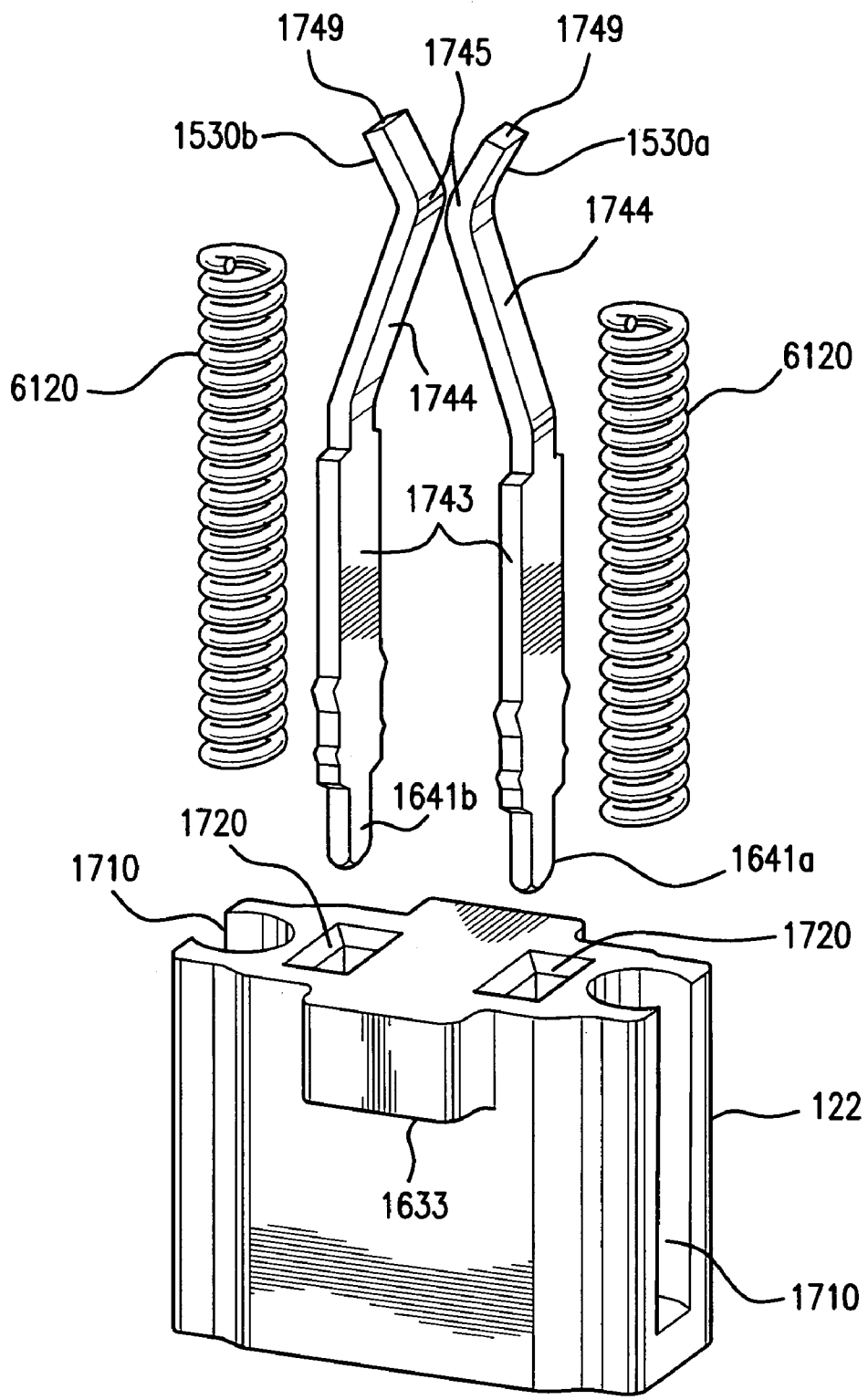

FIGS. 16 and 17 further illustrate cell 1570 according to one embodiment. FIG. 17 is an exploded view of cell 1570. As shown, the housing 122 is generally rectangular in shape and includes apertures 1710 for receiving springs 1520 and apertures 1720 for receiving contact members 1530. Apertures 1720 extend from the top side of housing to bottom side of the housing so that proximal ends 1641 of contact members 1730 can project beyond the bottom side of housing 122, as shown in FIG. 16.

Apertures 1710 extend from the top surface of housing 122 towards the bottom surface, but do not reach the bottom surface. Accordingly, when a spring 1520 is inserted into an aperture 1710 the proximal end will not project beyond the bottom surface of housing 122. While open apertures 1710 are illustrated, it is understood that closed apertures can also be used As illustrated in FIG. 17, each contact member 1530, according to the embodiment shown, has a proximal end 1641 and a distal end 1749. Between ends 1641 and 1749 there is a base portion 1743, a transition portion 1744 and a contact portion 1745. Base portion 1743 is between proximal end 1641 and transition portion 1744, transition portion is between base portion 1743 and contact portion 1745, and contact portion 1745 is between transition portion 1744 and distal end 1749. In the embodiment shown, base portion 1743 is disposed in aperture 1720 so that generally the entire base portion is within housing 122, transition portion 1744 is angled inwardly with respect to the base portion, and distal end 1749 is angled outwardly with respect to the transition portion and therefore functions as a lead-in portion.

In a preferred embodiment, the contact portion of a contact member is not fixed to the end of the conductor with which it makes physical and electrical contact. For example, the contact portions are not soldered or otherwise fixed to the board 120 conductors, as is typical in the prior art. Instead, in a preferred embodiment, a contact member 1630 is electrically connected to its corresponding conductor with a wiping action similar to that used in card edge connectors. That is, the contact portion of the contact member merely presses against the end of the corresponding conductor. For example, referring back to FIG. 15, the contact portion of contact member 1530a merely presses or pushes against the end portion of conductor 201. Because it is not fixed to the conductor, the contact portion can move along the length of the conductor while still pressing against the conductor, creating a wiping action. This wiping action may ensure a good electrical connection between the contact members and the corresponding electrical conductors of the printed circuit boards 120.

Figure 18:
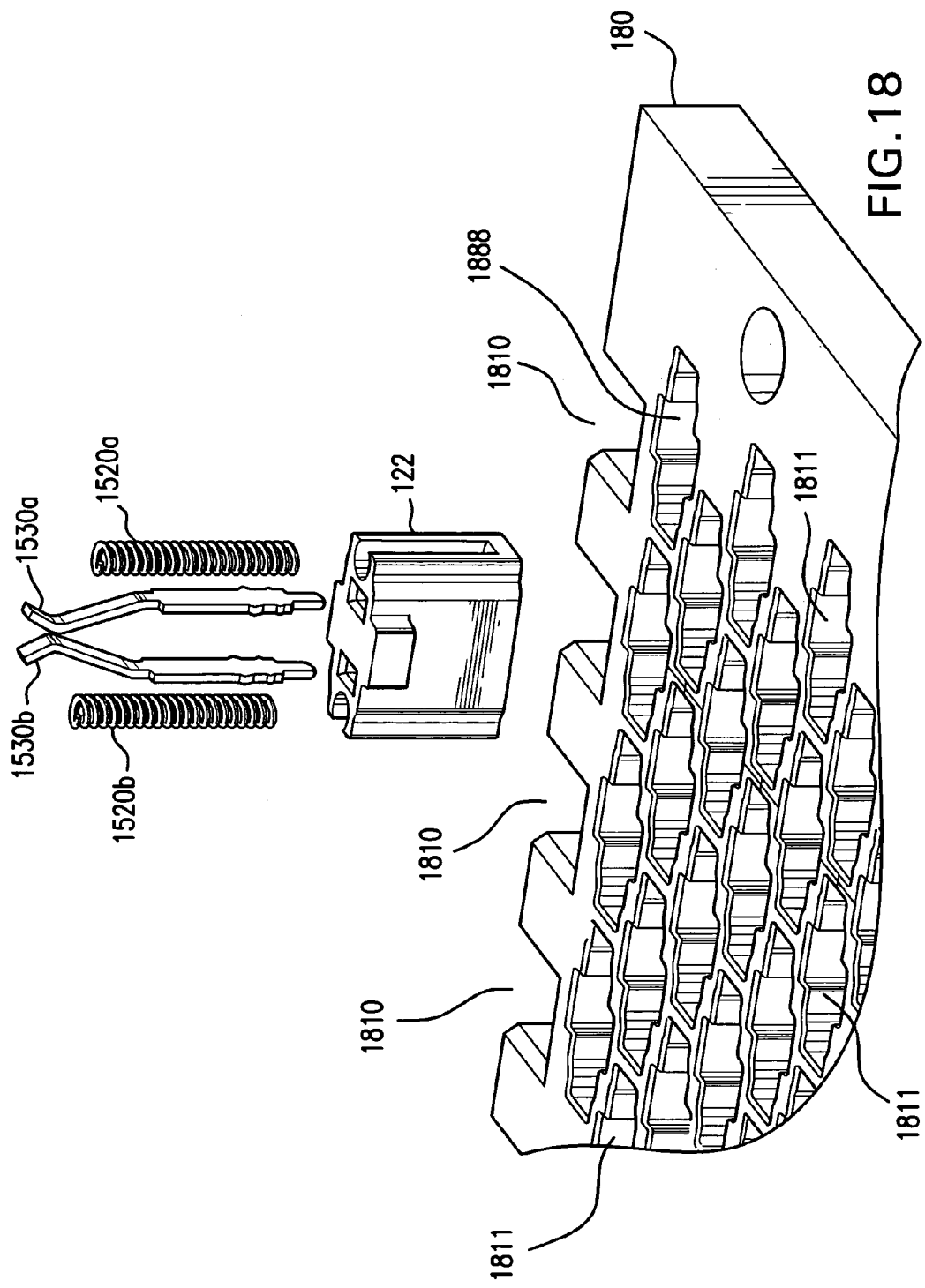
FIGS. 18 and 19 illustrate that cells may be configured to fit into an aperture of an interposer.
Figure 19:
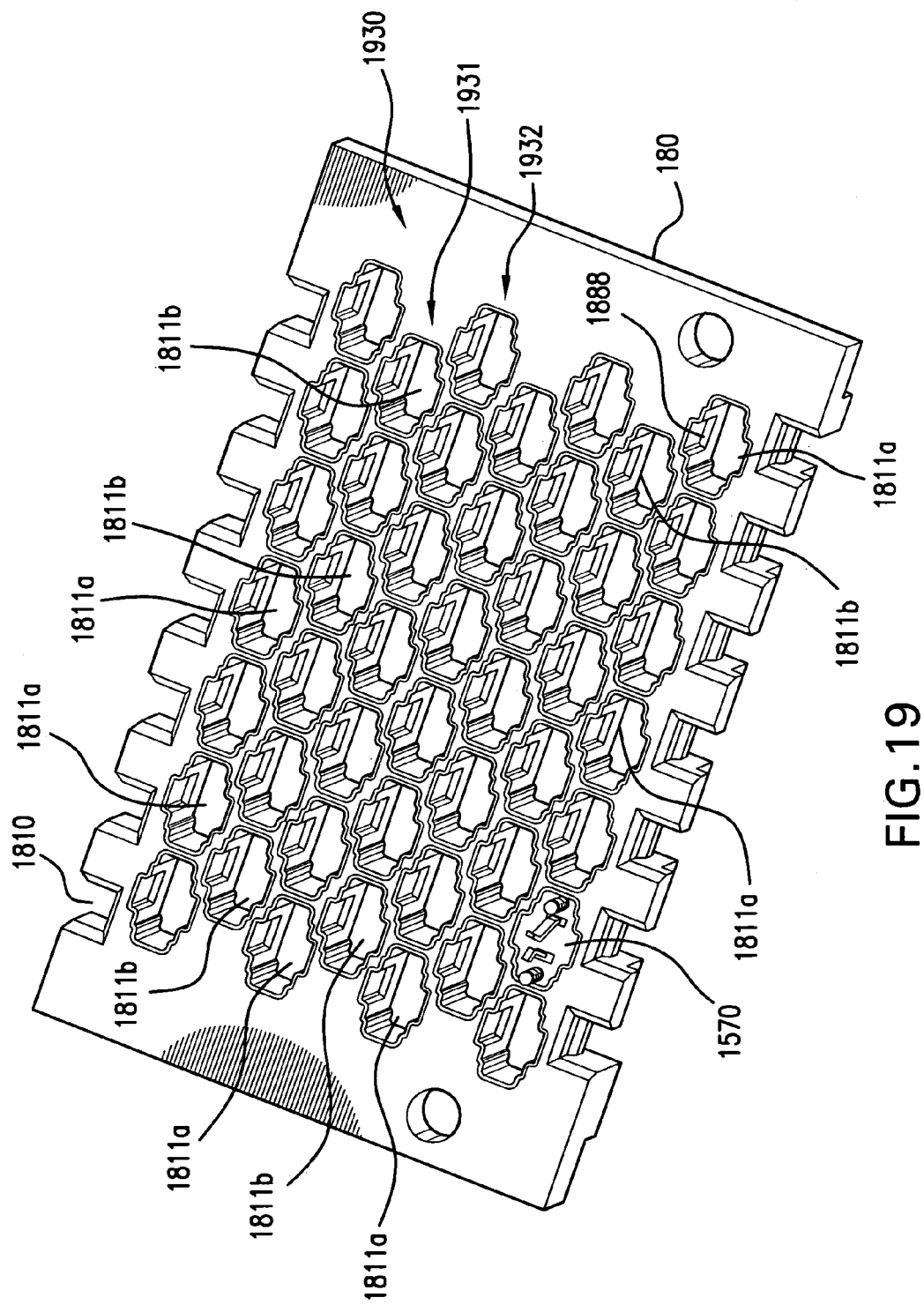

Referring now to FIGS. 18 and 19, FIGS. 18 and 19 illustrate that each cell 1570 is designed to fit into an aperture 1811 of an interposer 180. In the embodiment shown, each interposer 180 includes a first set of apertures 1811a (see FIG. 19) arranged in a first set of aligned rows to create a first row and column configuration and a second set of apertures 1811b arranged in a second set of aligned rows to create second row and column configuration. In the embodiment shown, each row in the second set is disposed between two rows from the first set. For example, row 1931, which is a row of apertures 1811b, is disposed between rows 1930 and 1932, each of which is a row of apertures 1811a.

As shown in the figures, the second row and column configuration is offset from the first row and column configuration so that the apertures of the second set are aligned with each other but not aligned with the apertures of the first set, and vice-versa An interposer 180 may electromagnetically shield the electrical conductors of the printed circuit boards 120 by being fabricated either of a conductive material or of a non-conductive material coated with a conductive material.

Figure 20:
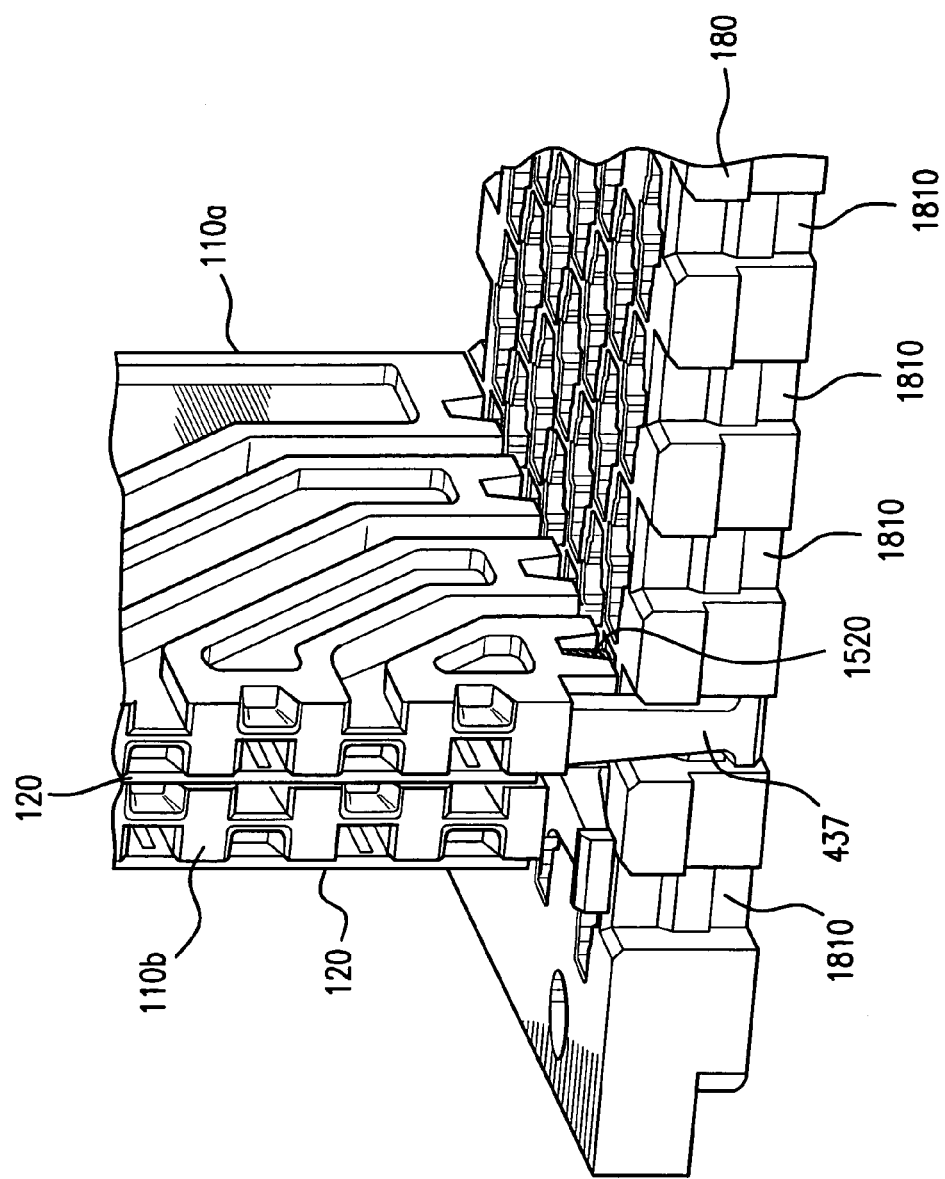
FIG. 20 illustrates a finger of a spacer inserted into a corresponding notch of an interposer.

As also shown in FIGS. 18 and 19, interposers 180 include notches 1810 along a top and bottom side. Each notch 1810 is designed to receive the end of a finger of a spacer 110. Preferably, the finger snaps into a corresponding notch to firmly attach the spacer 110 to the interposer 180. This feature is illustrated in FIG. 20.

When connector 100 is fully constructed, each aperture in the first and second set receives a cell 1570. The housing 122 of each cell 1570 has a tab 1633 arranged to fit within a slot 1888 disposed within a corresponding aperture of the interposer 180, which slot 1888 does not extend the entire length of the aperture. The tab 1633, therefore, prevents the cell 1570 from falling through the aperture. It is to be understood that the specific shape of the cells and corresponding apertures are merely for exemplary purposes. The present invention is not limited to these shapes.

Figure 21:
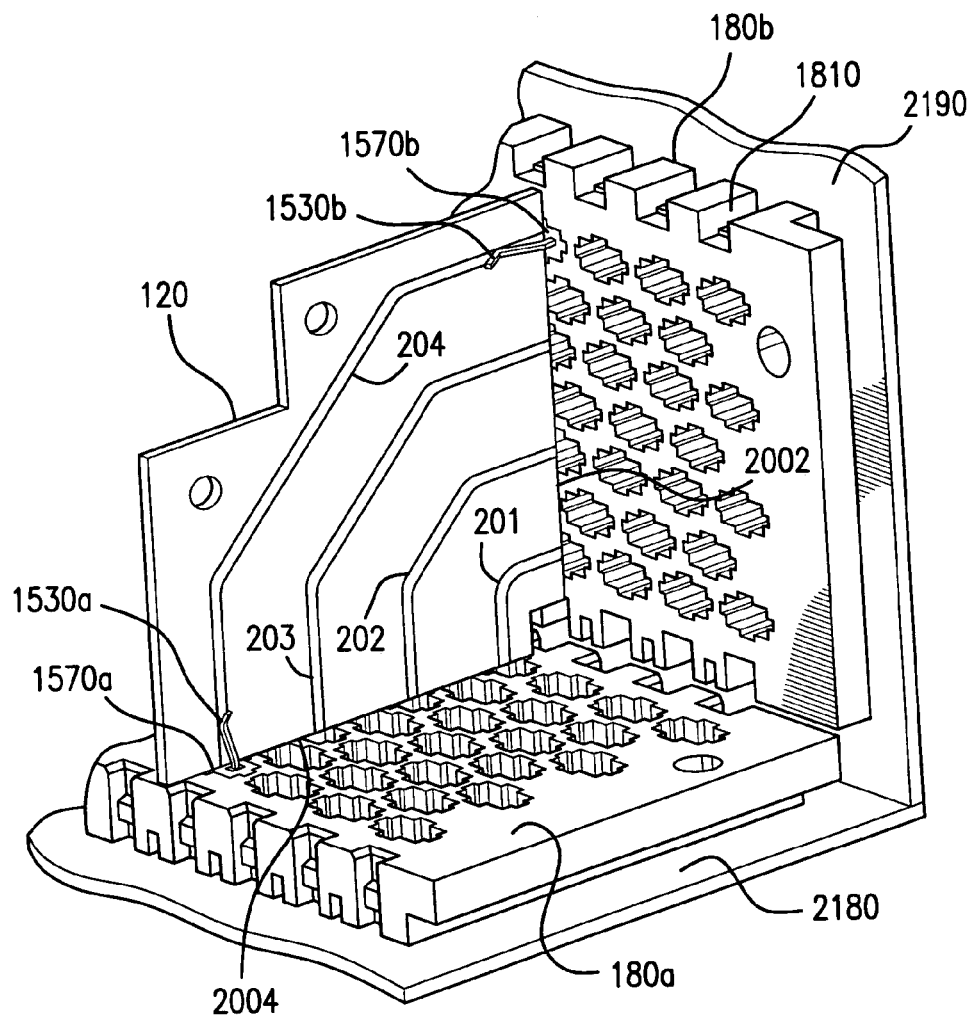
FIG. 21 illustrates the arrangement of the interposers 180 in relation to board 120 and in relation to boards 2190 and 2180, according to one embodiment

Additionally, when connector is fully constructed, the interposers are arranged so that the contact portion 1745 of each contact member 1530 contacts a corresponding conductor. FIG. 21 illustrates this concept.

FIG. 21 illustrates the arrangement of the interposers 180 in relation to board 120 and in relation to boards 2190 and 2180. The spacers 110 are not shown in the figure to illustrate that board 120 and interposers 180 are arranged so that the front side 2102 of board 120 is aligned with the center line of a column of apertures on spacer 180b and so that the bottom side 2104 of board 120 is aligned with the center line of a column of apertures on spacer 180a. FIG. 21 also shows two cells 1570, each disposed in an aperture of an interposer 180. As shown in FIG. 21, a contact member 1530 of each cell 1570 makes physical contact with a corresponding conductor.

Although not shown in FIG. 21, when connector 100 is in use, the proximal end 1641 of each contact member 1530a,b contacts a conducting element on a circuit board connected to connector 100. For example, end 1641 of contact member 1530b contacts a conducting element on circuit board 2190 and end 1641 of contact member 1530a contacts a conducting element on circuit board 2180. Accordingly, FIG. 21 illustrates that there is at least one electrical signal path from board 2190 to board 2180 through connector 100. This electrical signal path includes conductor 214, contact member 1530b and contact member 1530a. As is appreciated by one skilled in the art, connector 100 provides multiple electrical signal paths from board 2190 and 2180, wherein each signal path includes two contact members 1530 and a conductor on a board 120.

According to the embodiment illustrated in FIG. 21, each interposer is arranged in parallel relationship with one circuit board connected to connector 100. More specifically, interposer 180a is in parallel relationship with circuit board 2180 and interposer 180b is in parallel relationship with circuit board 2190. Accordingly, one face of interposer 180a faces board 2180 and one face of interposer 180b faces board 2190.

Figure 22:
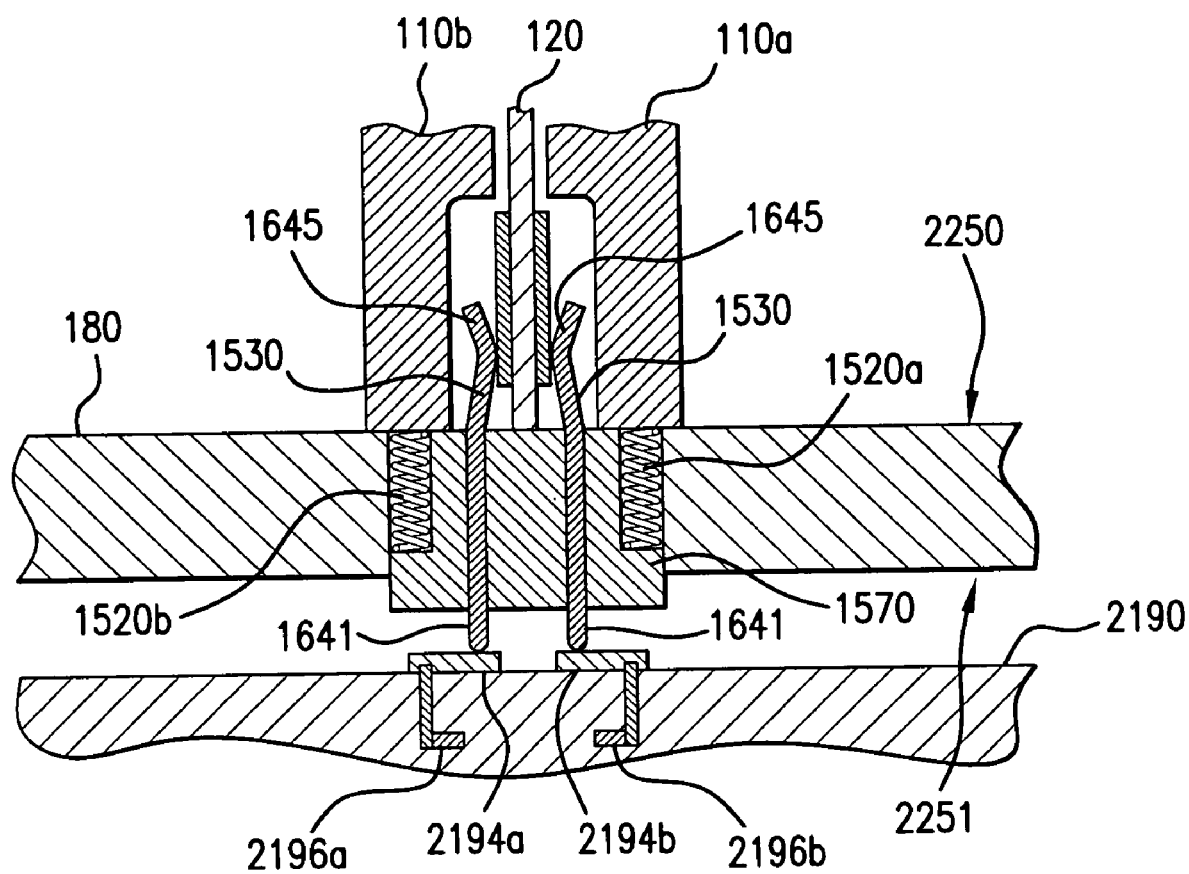
FIG. 22 is a cross-sectional view of an embodiment of the connector 100.

Referring now to FIG. 22, FIG. 22 is a cross-sectional view of the connector 100 and shows that when connector 100 is in use, as described above, each proximal end 1641 of each contact member 1530 contacts a conducting element 2194 on circuit board 2190. In a preferred embodiment, each conducting element 2194 is a signal pad, and not a via. Accordingly, in a preferred embodiment, connector 100 is a compression mount connector because each proximal end 1641 merely presses against the circuit board and is not inserted into a via in the circuit board. However, in other embodiments, each element 2194 may be a via or other electrically conducting element.

in a preferred embodiment, the board 2190 includes a differential signal path that includes a first signal path 2196a (e.g., a first trace) and a second signal path 2196b (e.g., a second trace). As shown, the first pad 2194 is connected to the first signal path 2196a and the second conducting element 2194b is is connected to the first signal path 2196b. It should be noted that the second circuit board 2180 may also have a pair of conducting elements, like elements 2194, electrically connected to a pair of signal paths, like paths 2196.

As shown in FIG. 22, a cell 1570 is inserted into an aperture of interposer 180. As further shown, the distal end of each contact member 1530 of cell 1570 extends beyond the upper face 2250 of the interposer and the proximal end 1641 of each contact member 1530 extends beyond the bottom face 2251 of the interposer, which faces board 2190 and is generally parallel thereto. Each proximal end 1641 presses against a conducting element 2194 on board 2190. Likewise, each contact portion 1745 of contact member 1530 presses against a conductor on board 120. Thus, a contact member 1530 electrically connects a conductor on board 120 with a conducting element 2194 on board 2190. As illustrated in FIG. 22, the ends of the conductors on board 120 are near the upper face 2250 of interposer.

When end 1641 of a contact member 1530 presses against a corresponding element 2194 a normal force caused by the element is exerted on the contact member. Because the contact member 1530 is held firmly within housing 1570, the normal force will cause housing 122 to move in the direction of the normal force (i.e., away from the circuit board 2190). However, springs 1520 limit how far housing 122 will move away from board 2190 because when the housing 122 moves away from board 2190, springs 1520 will compress and exert a force on the housing in a direction that is opposite of the direction of the normal force caused by board 2190. This is so because the distal ends of the springs abut a surface of a spacer 110 and the spacer is firmly attached to the interposer 180, which itself does not move relative to the board 2190. Thus, springs 1502 will compress and exert a force on housing in a direction opposite the normal force.

Referring back to FIG. 1, each spacer 110 may be configured to attach to an elongate backbone 150. Additionally, connector 100 may include two end caps 100a and 100b, each of which is designed to attach to a respective end of backbone 150. The backbone 150 and end caps 100 are discussed below.

Figure 23:
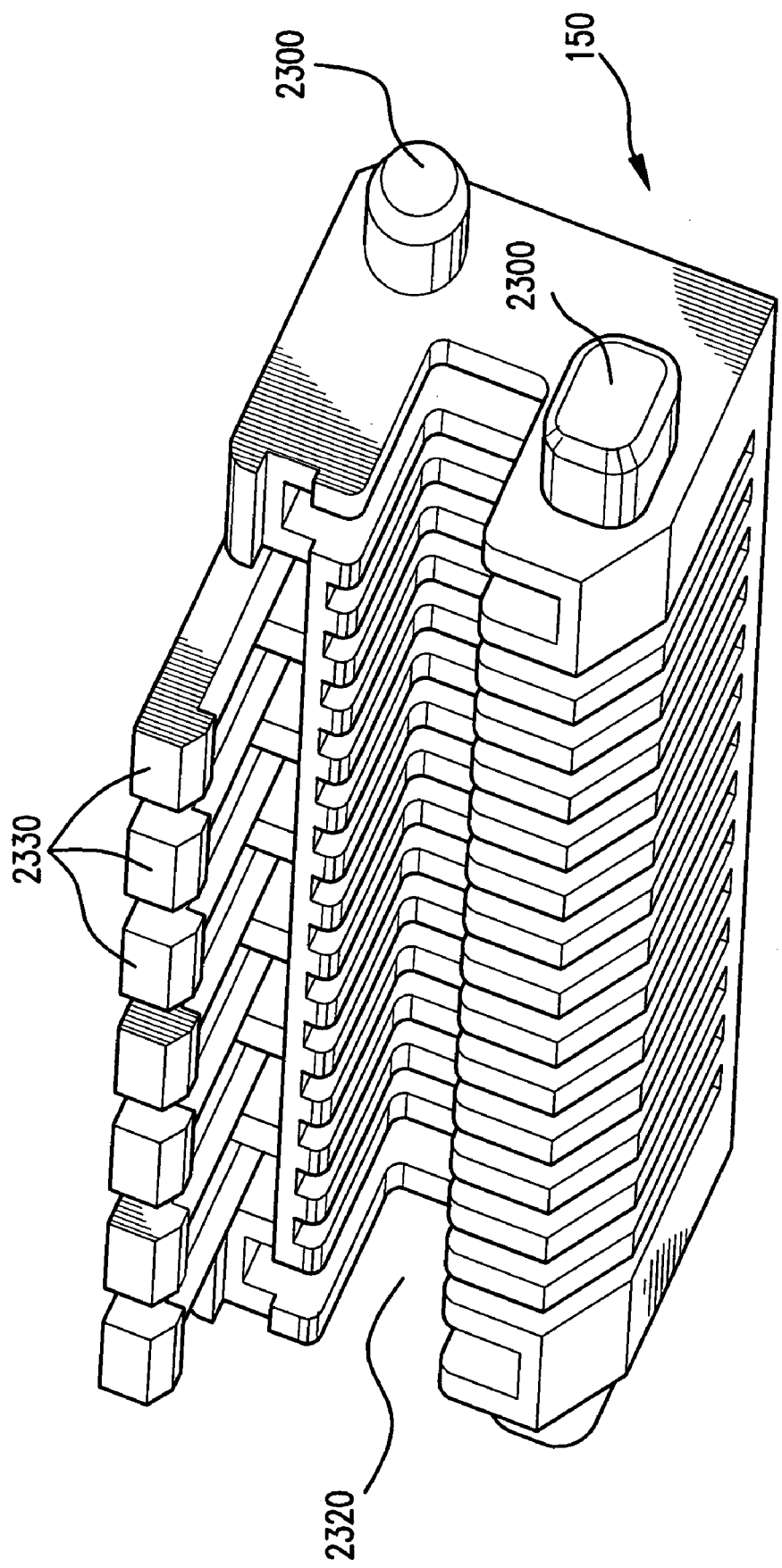
FIG. 23 illustrates an embodiment of backbone 150.
Figure 27:
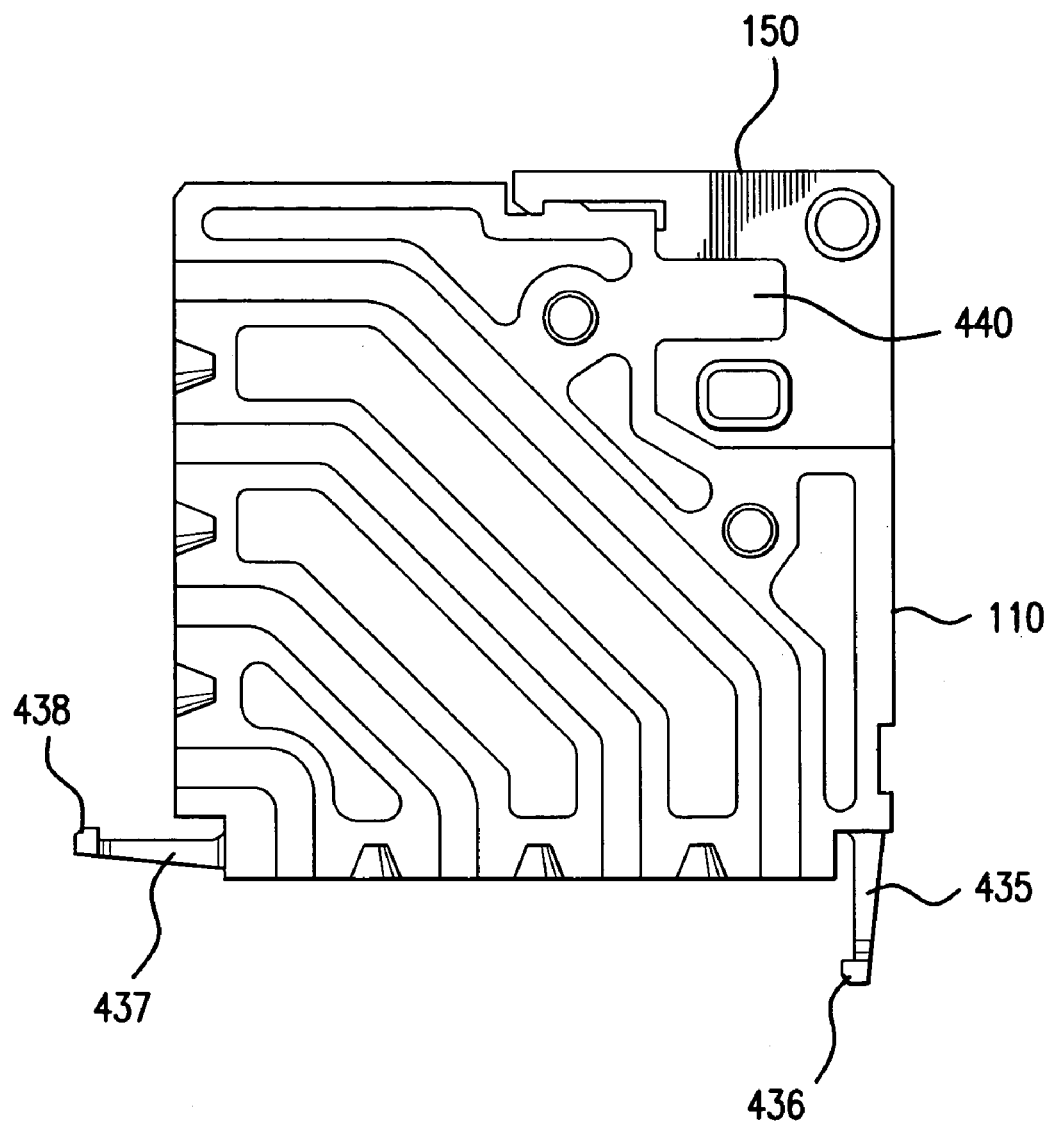
FIG. 27 is a view of a spacer connected to backbone 150.

Referring to FIG. 23, FIG. 23 illustrates an embodiment of backbone 150. Backbone 150, according to the embodiment shown, includes bosses 2300 arranged to mate with the end caps 100 as well as slots 2320, each arranged to receive finger 440 of a spacer 110, as shown in FIG. 27. Backbone 150 may further include tines 2330 arranged to mate with the spacers 110.

Figure 24:
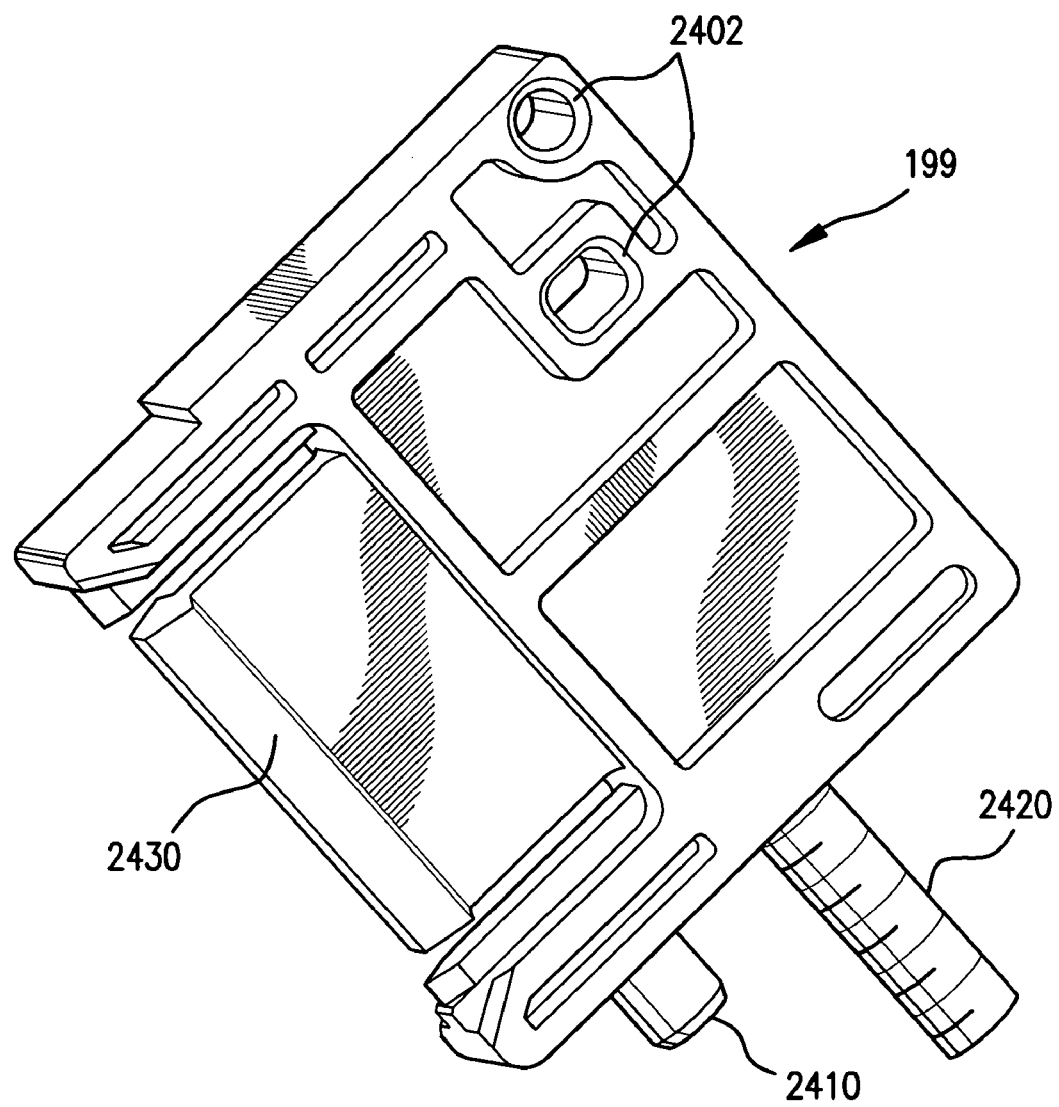
FIG. 24 illustrates an embodiment of an end cap 199.

Referring to FIG. 24, FIG. 24 illustrates an embodiment of an end cap 199. End cap 199, according to the embodiment shown, includes apertures 2402 arranged to mate with bosses disposed on adjacent spacers as well as bosses 2300 disposed on the backbone 150. The end cap 199 further includes both a screw 2420 and a pin 2410 arranged to mechanically interface connector 100 with a circuit board, which may have a large number of layers, for example, more than 30 layers, as well as a tongue 2430 arranged to mate with an end plate 190b (see FIGS. 1 and 25).

While the end cap 199 is illustrated as being symmetrical, that is, can be used on either end of connector 100, separate left and right-handed end caps may also be used. The screw 2420 and pin 2410 of the end cap 199 may be integrally formed with the end cap 199 or may be attached thereto after fabrication of the end cap 199. It has been found that it is often necessary to utilize a metal rather than a plastic screw 2420 in view of the mechanical stresses involved. It is understood that the present invention is not limited to the use of a screw 2420 and pin 2410 but rather other fastening means may also be used.

As noted previously, both the end caps 100 and spacers 110 can be fabricated of an insulative material, such as a plastic, covered with a conductive material to provide electromagnetic shielding or can be fabricated entirely of a conductive material, such as a metal.

Figure 25:
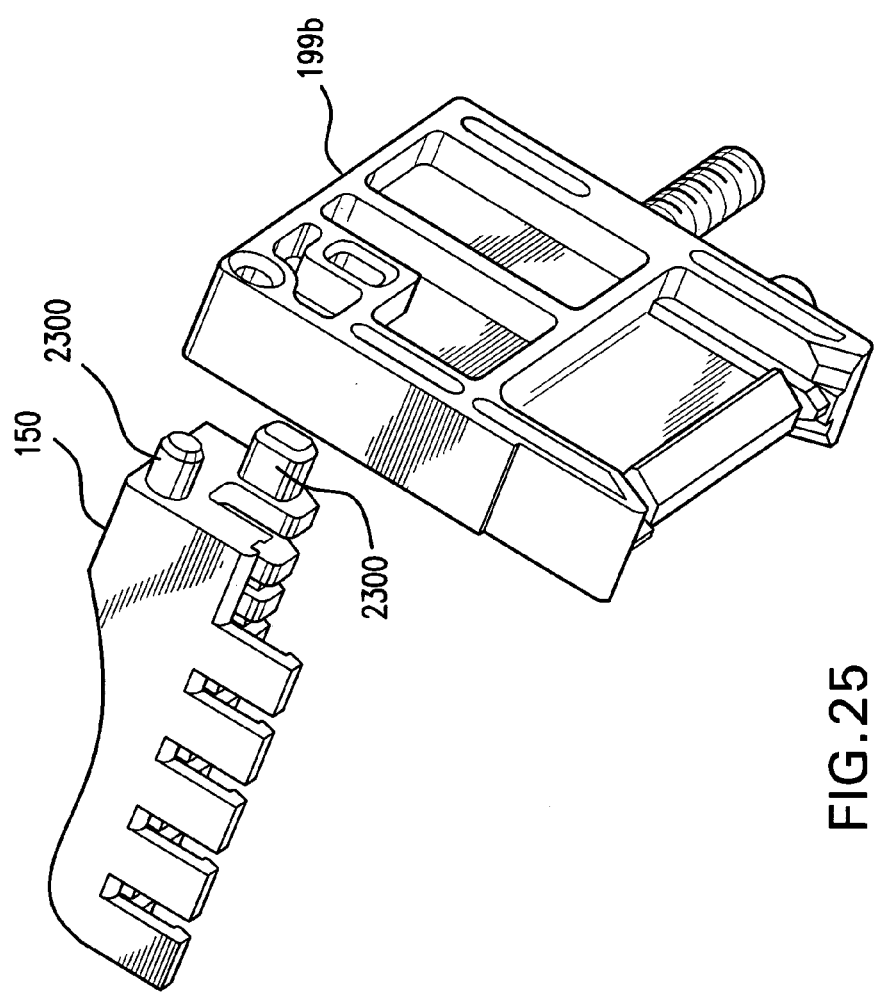
FIG. 25 is an exploded view of backbone 150 and an end cap 199.
Figure 26:
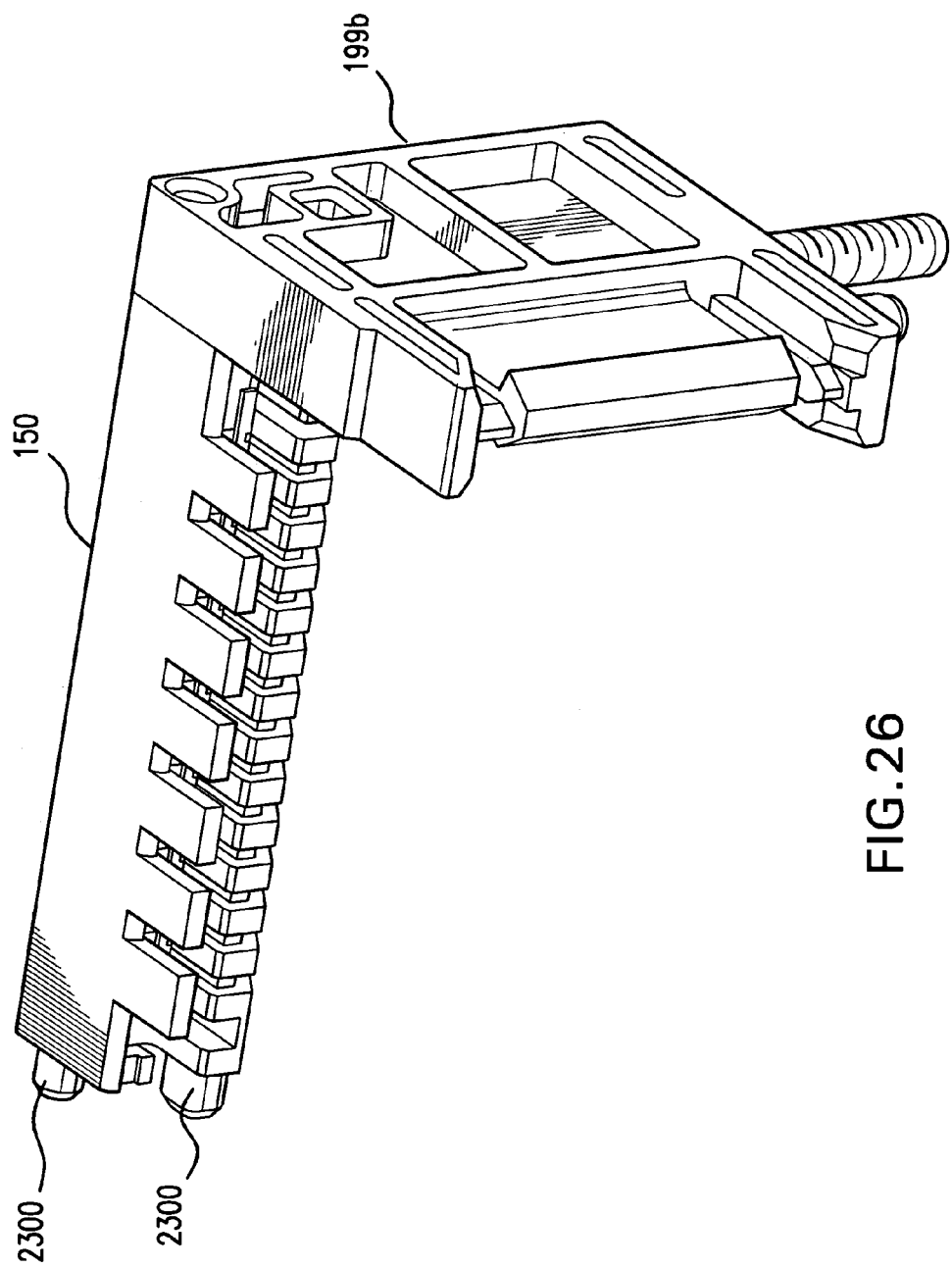
FIG. 26 is a view of a backbone 150 and an end cap 199 assembled together.

FIG. 25 is an exploded view of backbone 150 and an end cap 199 and FIG. 26 is a view of a backbone 150 and an end cap 199 assembled together.

Referring to FIGS. 25 and 26, the bosses 2300 of the backbone 150 are disposed within corresponding apertures 2402 in the end caps 100 forming a rigid structure. The use of bosses 2300 and apertures 2402 is for exemplary purposes and the present invention is not limited thereto. That is, other fastening means can be used to mechanically connect the backbone 150 to the end caps 100.

Furthermore, as shown in FIG. 27, a combination of fingers 440 and mating slots are used to mechanically connect the spacers 110 to the backbone 150. The illustrated combination is for exemplary purposes and the present invention is not limited thereto. In a similar fashion, as discussed above, the fingers 435, 437, 835, 837 of the spacers 110 are arranged to mate with corresponding slots in the interposer 180. The illustrated combination of fingers and slots is for exemplary purposes and the present invention is not limited thereto.

Referring back to FIG. 1, FIG. 1 shows that connector 100 may also include a two mounting clips 190*a* and 190*b* and a shield 160. Mounting clips 190 and shield 160 are combined with the above described parts of the connector 100 to form a composite arrangement. The mounting clip 190 and shield 160 may be electrically conductive so as to electromagnetically shield the signal carrying elements of connector 100. The mounting clip 190 and shield 160 will be discussed in detail below.

Figure 28:
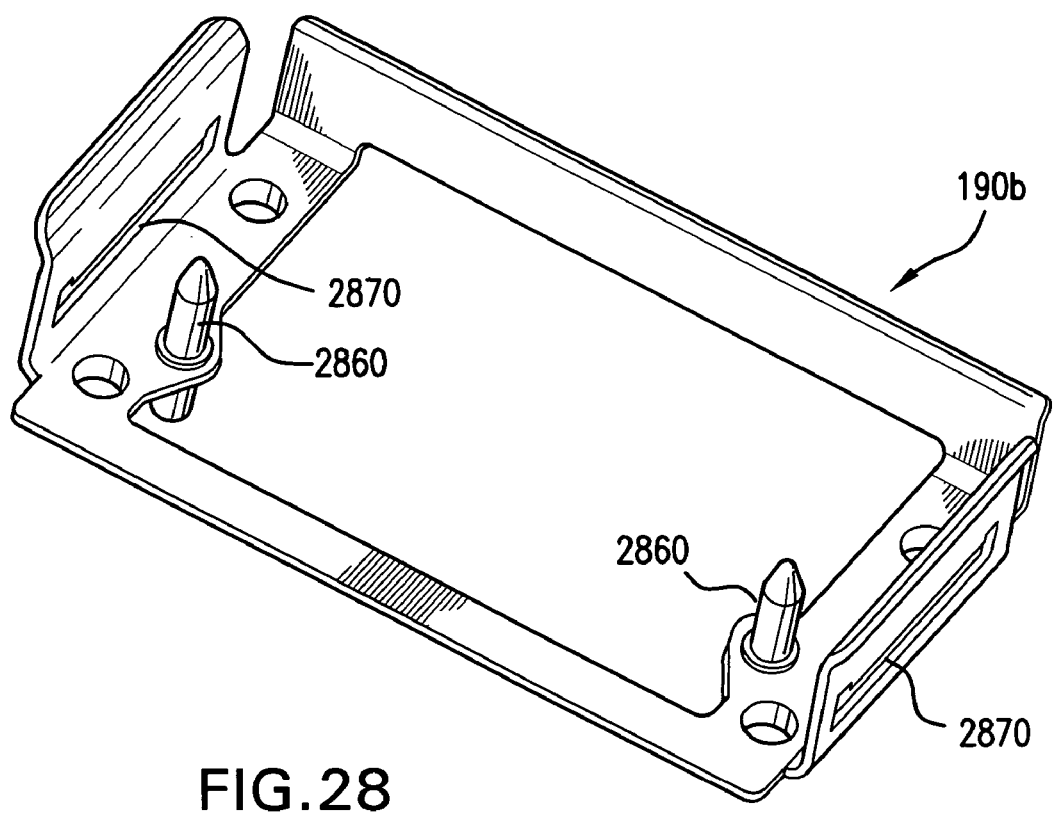
FIG. 28 illustrates an embodiment of mounting clip 190b.

FIG. 28 illustrates an embodiment of mounting clip 190*b*. Mounting clip 190*b*, according to the embodiment shown, includes: (a) pins 2860 arranged to mate with a hole in a circuit board (e.g., board 2190 or 2180) and (b) slots 2870 arranged to receive the tongues and 2430 of the end caps 100. Pins 2860 function to connect clip 190*b* to a circuit board by mating with the circuit board holes mentioned above. Pins 2860 may be electrically conducting and may electrically and physically connect to a ground plane of the circuit board to which it is connected.

Figure 29:
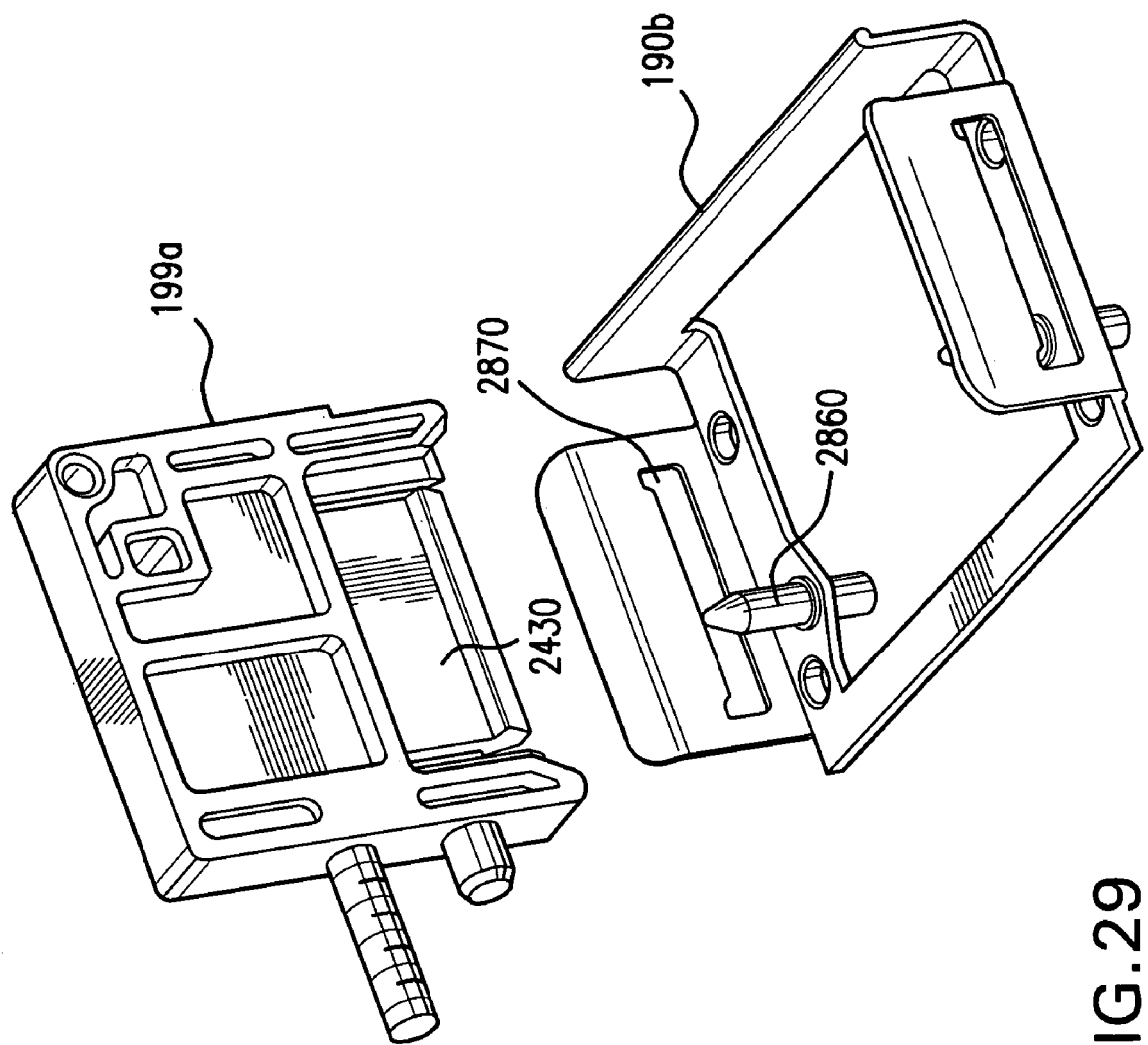
FIG. 29 is an exploded view of clip 190b and end cap 199.
Figure 30:
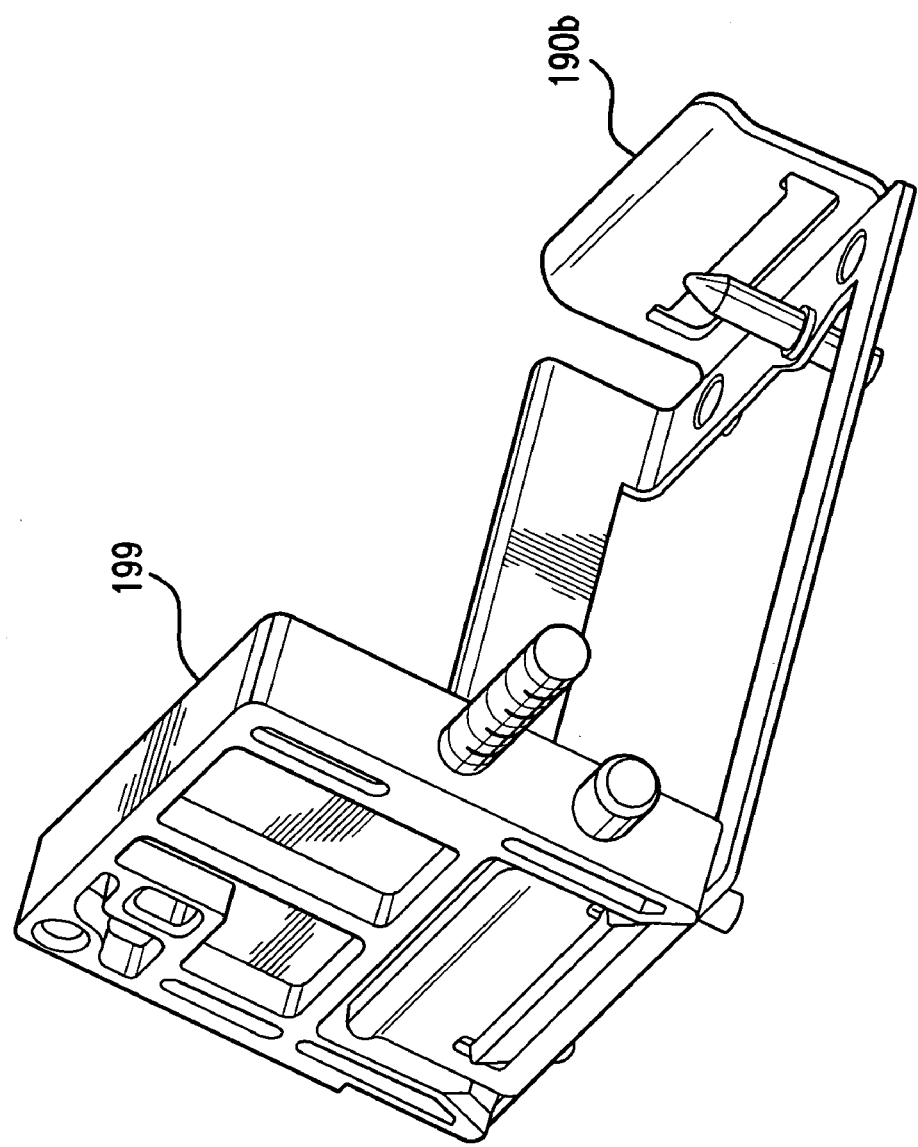
FIG. 30 is a view of clip 190b having an end cap 199 attached thereto.

FIG. 29 is an exploded view of clip 190*b* and end cap 199 and FIG. 30 is a view of clip 190*b* having an end cap 199 attached thereto. As shown in FIG. 30, tongue 2430 of end cap 199 is arranged to mate with a corresponding slot 2870 in clip 190*b*. As with the other illustrated fastening means, the present invention is not limited to the use of a tongue and corresponding slot.

Figure 31:
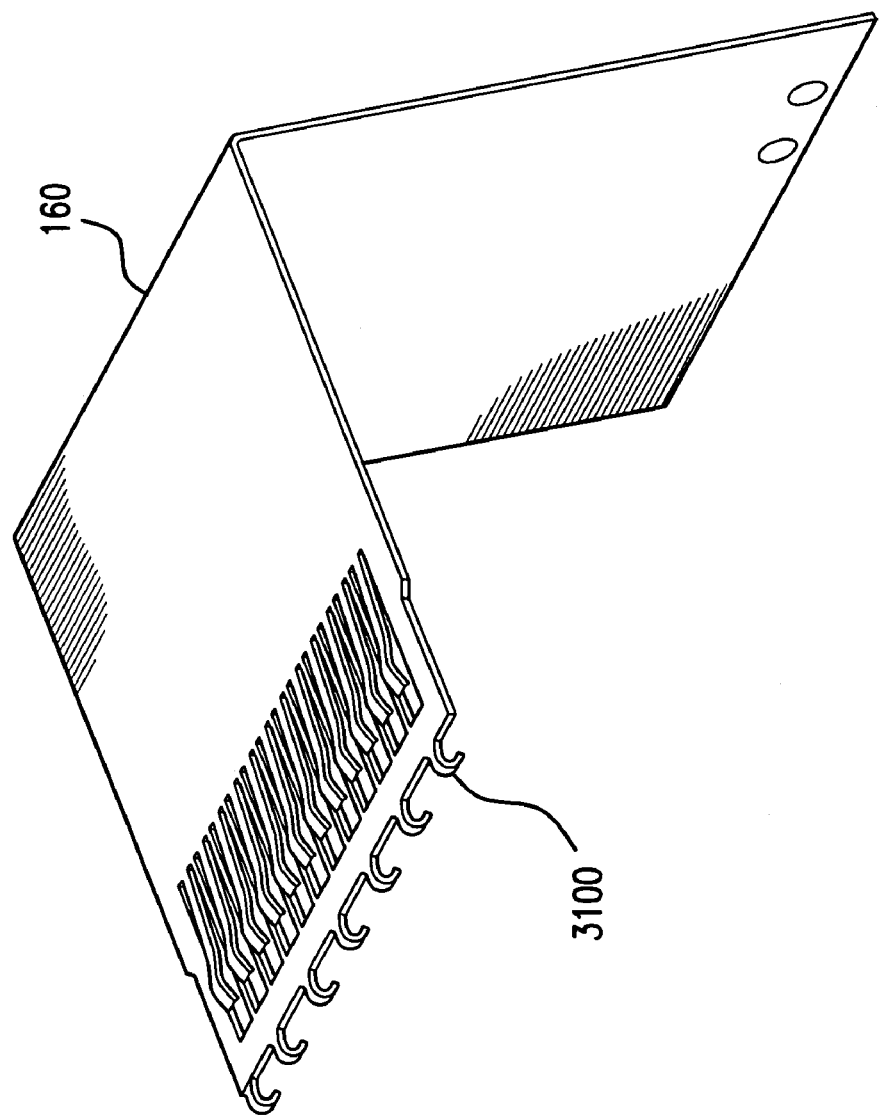
FIG. 31 illustrates an embodiment of shield 160.
Figure 32:
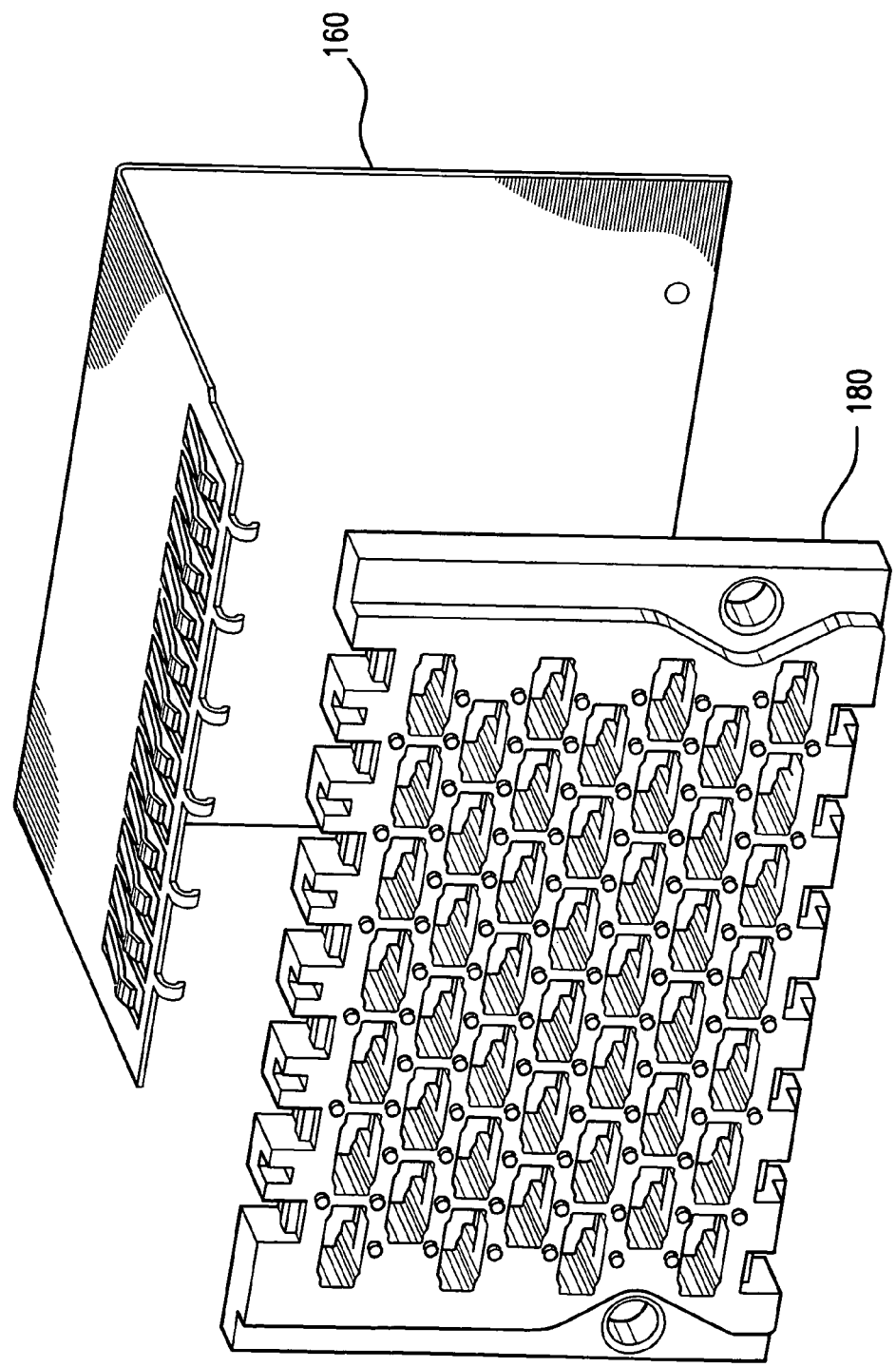
FIG. 32 is an exploded view of shield 160 and an interposer 180.
Figure 33:
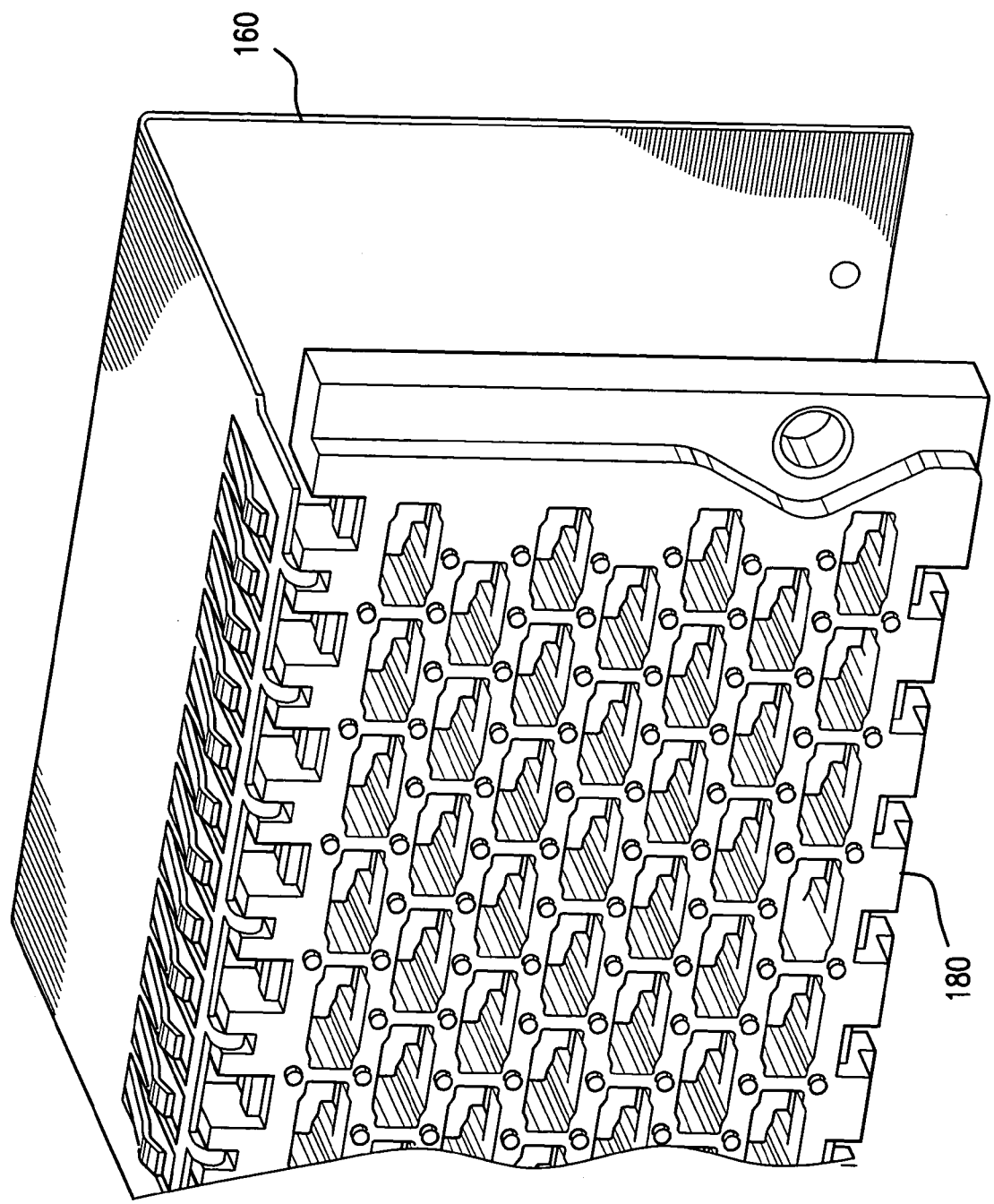
FIG. 33 is a view of shield 160 being connected to an interposer 180.

Referring now to FIG. 31, FIG. 31 illustrates an embodiment of shield 160. Shield 160, according to the embodiment shown, includes hooks 3100 arranged to fit in slots in an interposer 180. FIG. 32 is an exploded view of shield 160 and an interposer 180. FIG. 33 is a view of shield 160 being connected to an interposer 180. FIG. 33 illustrates how the hooks 3100 of shield 160 snap into slots in interposer 180, thereby mechanically connecting the two.

Figure 34:
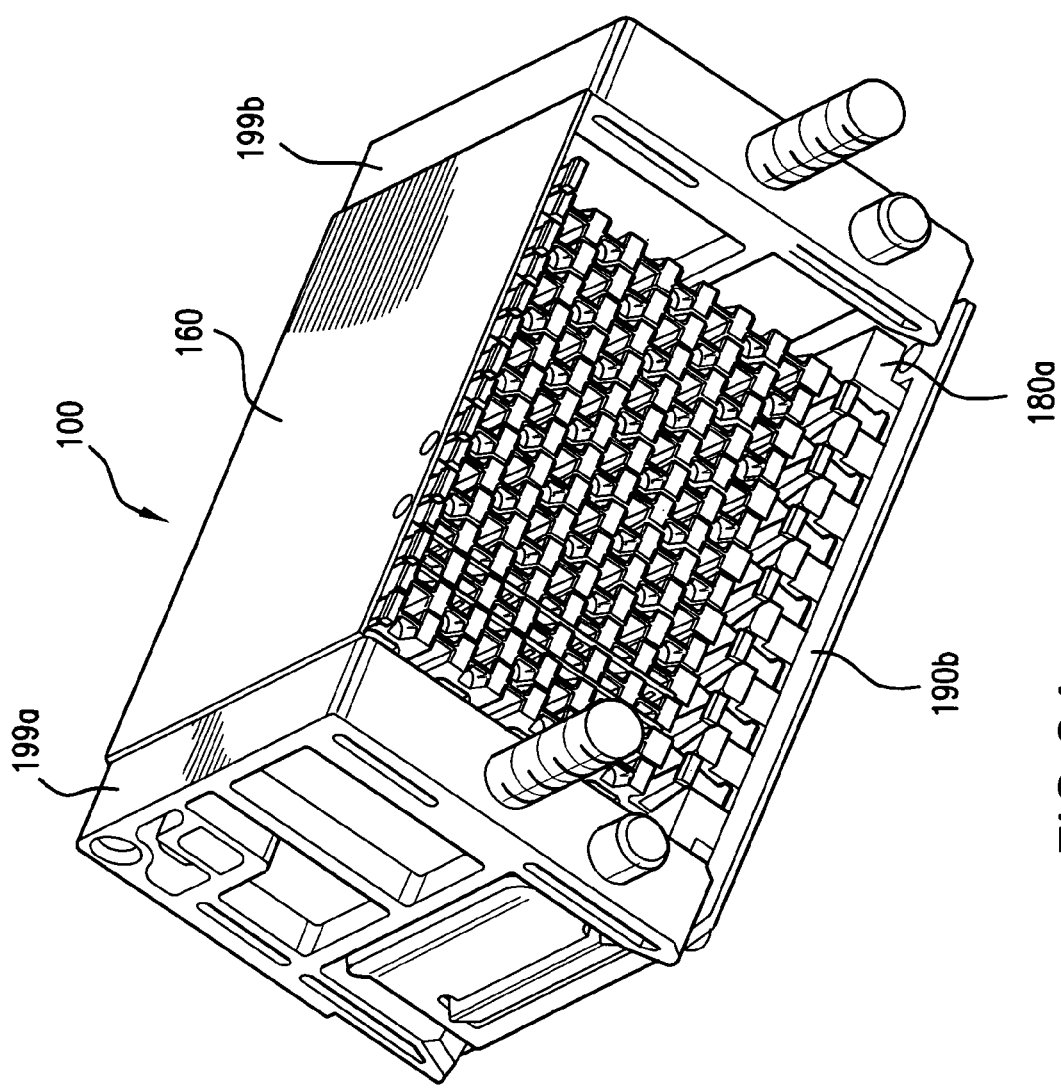
FIG. 34 is a view of an assembled connector with an interposer 180 and clip 190a omitted.
Figure 35:
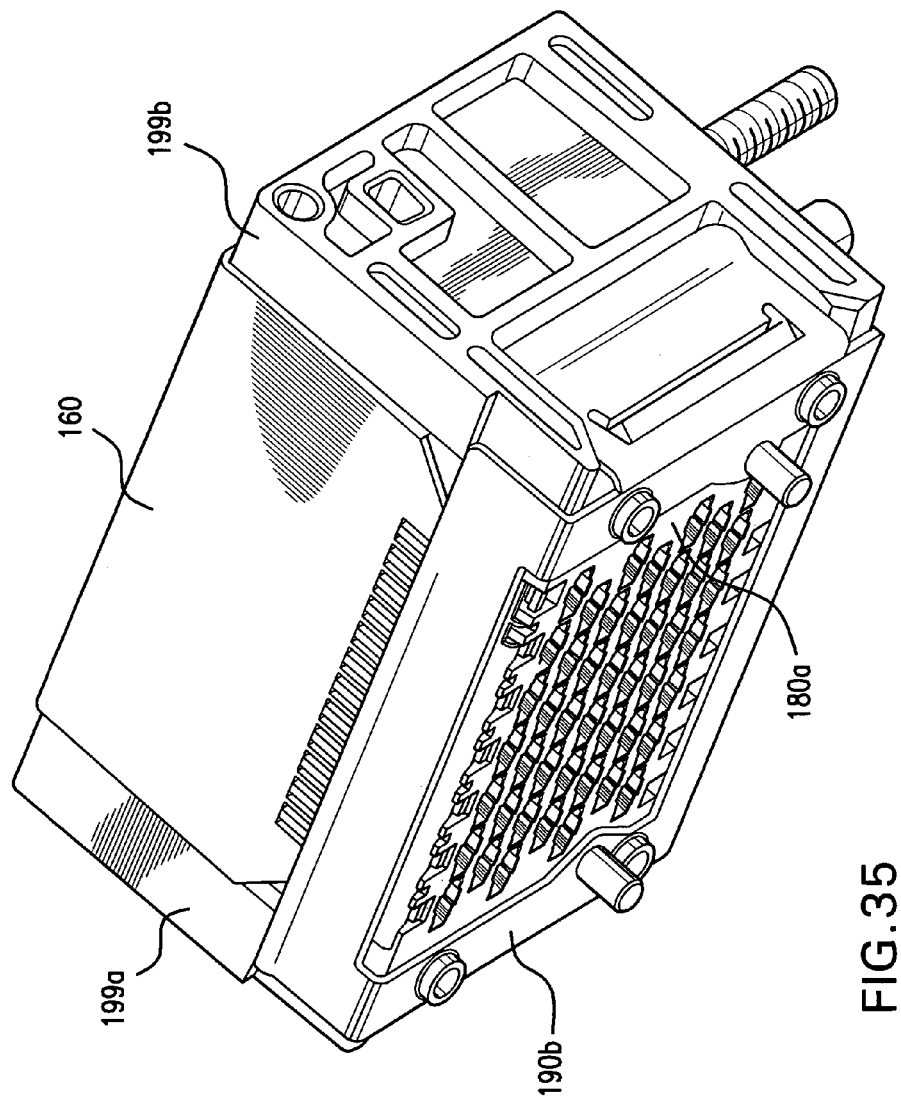
FIGS. 35 and 36 are different views of an almost fully assembled connector 100 according to one embodiment assembled without cells in FIG. 35 and with 2 cells in FIG. 36.
Figure 36:
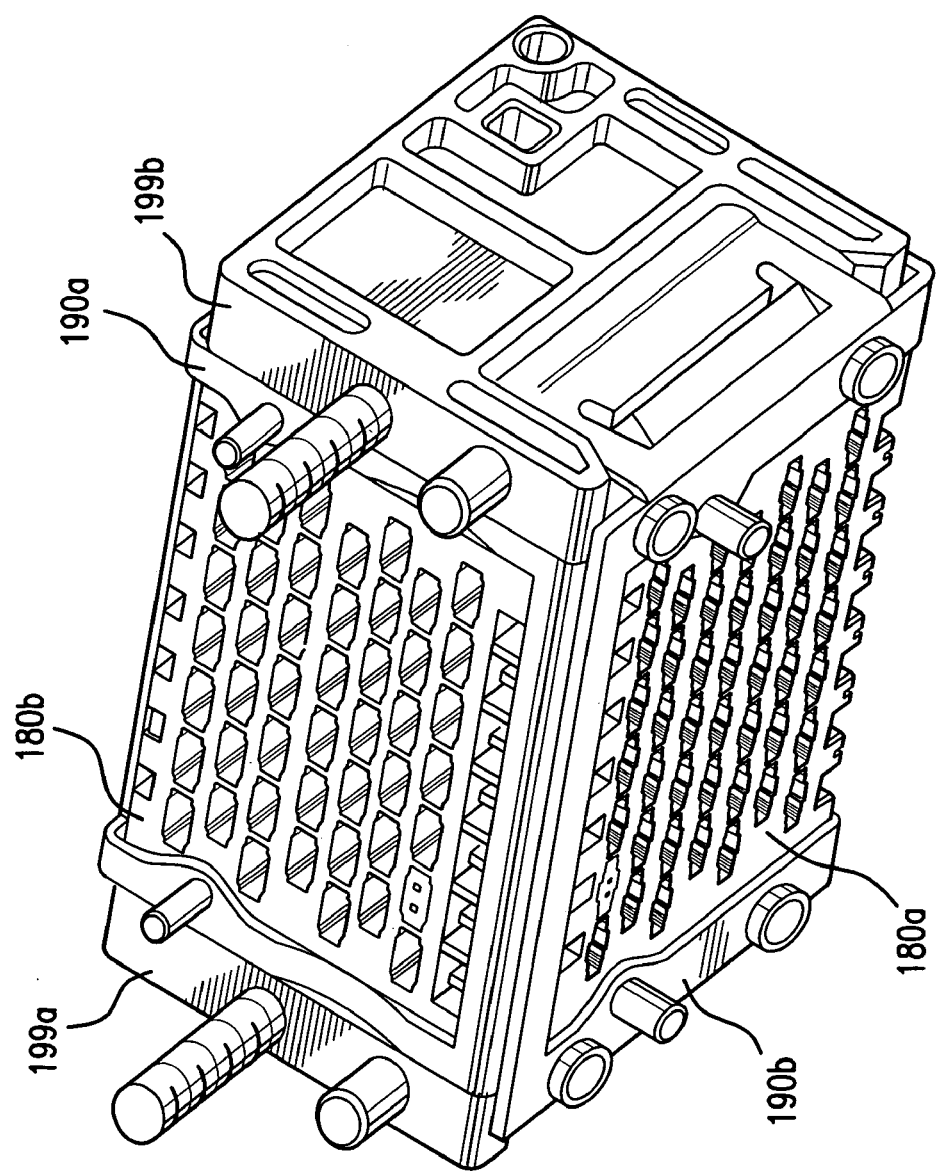

FIG. 34 is a view of an assembled connector with an interposer 180 and clip 190*a* omitted. FIGS. 35 and 36 are different views of an almost fully assembled connector 100 according to one embodiment. When fully assembled, each aperture in each interposer holds a cell 1570. Referring to FIG. 35, FIG. 35 shows end caps 199*a* and 199*b*, shield 160, interposer 180*a* and clip 190*b*.

Referring to FIG. 36, FIG. 36 shows end caps 199*a* and 199*b*, interposers 180*a* and 180*b*, and clips 190*a* and 190*b*. The clip 190*a* may be attached to the overall assembly by any usual fastening means and can include pins or other fastening means to attach the assembled connector 100 to a daughtercard, for example.

The additional interposer 180*b* and additional clip 190*a* may be identical to the interposer 180*a* and end plate 190*b* or can be different (or not present at all), depending upon the application of the interconnection system assembly.

While the two interposers 180 have been illustrated as being perpendicular to each other, the present invention is not limited thereto. That is, for some applications, the planes of the two interposers 180 can be at a 45-degree angle or other angle, for example. Thus, connector 100 need not be a "right-angle" connector.

As can be seen from FIGS. 34–36, the entire interconnection system assembly attaches together to form a rigid structure in which the electrical conductors on the printed circuit boards 120 may be entirely electromagnetically shielded.

While various embodiments/variations of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. An interconnect system, comprising:
a first circuit board comprising (a) a first differential interconnect path, (b) a first signal pad on a surface of the first circuit board and (c) a second signal pad also on the surface of the first circuit board, wherein the first differential interconnect path comprises a first signal path electrically connected to the first signal pad and a second signal path electrically connected to the second signal pad;
a second circuit board comprising a second differential interconnect path; and
a connector for electrically connecting the first differential interconnect path with the second differential interconnect path, the connector comprising:
an interposer having a first face and a second face opposite the first face, the first face facing the surface of the first circuit board;
a first conductor having an end adjacent to the second surface of the interposer;
a second conductor parallel with and equal in length to the first conductor, the second conductor also having an end being adjacent to the second surface of the interposer;
a dielectric material disposed between the first conductor and the second conductor;
a first elongated contact member having a conductor contact section, a board contact section and an interim section between the conductor contact section and the board contact section, the conductor contact section being in physical contact with the end of the first conductor, the board contact section being in physical contact with and pressing against a surface of the first signal pad, but not being secured to the first signal pad, and the interim section being disposed in a hole extending from the first face of the interposer to the second face of the interposer, wherein the first signal pad exerts a force on the first contact member and the first contact member is free to move in the direction of the force to a limited extent, wherein the force is in a direction that is perpendicular to the surface of the first circuit board; and
a second elongated contact member having a conductor contact section, a board contact section and an interim section between the conductor contact section and the board contact section, the conductor contact section being in physical contact with the first end of the second conductor, the board contact section being in physical contact with and pressing against a top surface of the second signal pad, but not being secured to the second pad, and the interim section being disposed in a hole extending from the first face of the interposer to the second face of the interposer, wherein the second pad exerts a force on the second contact member and the second contact member is free to move in the direction of the force to a limited extent, wherein the force is in a direction that is perpendicular to the surface of the first circuit board.

2. The interconnect system of claim 1, wherein the dielectric material disposed between the first conductor and the second conductor comprises a third circuit board having a first face and a second face.

3. The interconnect system of claim 2, wherein the first conductor is disposed on the first face of the third circuit board and the second conductor is disposed on the second face of the third circuit board.

4. The interconnect system of claim 3, wherein the third circuit board is sandwiched between a first spacer and a second spacer.

5. The interconnect system of claim 4, wherein the first spacer has a groove on a first face thereof and the groove is aligned with and mirrors the first conductor.

6. The interconnect system of claim 4, wherein the first spacer has a finger for attaching the spacer to the interposer.

7. The interconnect system of claim 6, wherein the interposer has a recess for receiving the finger.

8. The interconnect system of claim 4, wherein the first spacer has a boss and the third circuit board has an aperture for receiving the boss.

9. The interconnect system of claim 8, wherein the second spacer has an aperture for receiving the boss.

10. The interconnect system of claim 9, wherein the second spacer has a groove on a first face thereof and the groove is aligned with and mirrors the second conductor.

11. The interconnect system of claim 4, wherein the third circuit board comprises a plurality of conductors disposed on the first face of the third circuit board and a plurality of conductors disposed on the second face of the third circuit board.

12. The interconnect system of claim 11, wherein each one of the plurality of conductors disposed on the second face of the third circuit board mirrors one of the plurality of conductors disposed on the first face of the third circuit board.

13. The interconnect system of claim 12, wherein the connector further comprises a fourth circuit board having a first face and a second face and a third spacer, wherein the fourth circuit board is sandwiched between the second spacer and the third spacer.

14. The interconnect system of claim 13, wherein the fourth circuit board comprises a plurality of conductors disposed on the first face of the fourth circuit board and a plurality of conductors disposed on the second face of the fourth circuit board.

15. The interconnect system of claim 14, wherein each one of the plurality of conductors disposed on the second face of the fourth circuit board mirrors one of the plurality of conductors disposed on the first face of the fourth circuit board.

16. The interconnect system of claim 15, wherein none of the conductors disposed on the fourth circuit board mirrors a conductor disposed on the third circuit board.

17. A connector for electrically connecting a signal path on a first circuit board with a signal path on a second circuit board, the connector comprising:

a first, a second and a third spacer, each spacer having a first face and second face opposite the first face;

a first circuit board sandwiched between the first and second spacers so that a first face of the first circuit board abuts the second face of the first spacer and a second face of the first circuit board abuts the first face of the second spacer, the second face of the first circuit board having a set of signal conductors disposed thereon, each of the signal conductors disposed on the second face of the first circuit board having a first end adjacent a first edge of the second face of the first circuit board, a second end adjacent a second edge of the second face of the first circuit board, and an interim section between the first end and the second end; and a second circuit board sandwiched between the second and third spacers so that a first face of the second circuit board abuts the second face of the second spacer and a second face of the second circuit board abuts the first face of the third spacer, the first face of the second circuit board having a set of signal conductors disposed thereon, each of the signal conductors disposed on the first face of the second circuit board having a first end adjacent a first edge of the first face of the second circuit board, a second end adjacent a second edge of the first face of the second circuit board, and an interim section between the first end and the second end, wherein the first edge of the second face of the first circuit board is parallel and spaced apart from the first edge of the first face of the second circuit board; and none of the signal conductors disposed on the first face of the second circuit board mirror any of the signal conductors disposed on the second face of the first circuit board.

18. The connector of claim 17, wherein a first set of grooves are disposed on the first face of the second spacer such that each of said grooves is mirrors one of the signal conductors disposed on the second face of the first circuit board, a second set of grooves are disposed on the second face of the second spacer such that each of said grooves is mirrors one of the signal conductors disposed on the first face of the second circuit board.

19. The connector of claim 17, further comprising an interposer to which each of said spacers connects, said interposer housing contact members disposed in apertures of said interposer, each of said contact members contacting one of said signal conductors.

20. The connector of claim 17, wherein the first face of the first circuit board has a plurality of signal conductors disposed thereon and the second face of the second circuit board has a plurality of signal conductors disposed thereon, wherein each of the plurality of signal conductors disposed on the first face of the first circuit board mirrors one of the signal conductors disposed on the second face of the first circuit board and each of the plurality of signal conductors disposed on the second face of the second circuit board mirrors one of the signal conductors disposed on the first face of the second circuit board.

21. The connector of claim 17, wherein the number of signal conductors disposed on the second face of the first circuit board is not equal to the number of signal conductors disposed on the first face of the second circuit board.

22. The connector of claim 21, wherein the number of signal conductors disposed on the second face of the first circuit board is one less or one more than the number of signal conductors disposed on the first face of the second circuit board.

23. A connector comprising:
a plurality of printed circuit boards each having at least one pair of electrical conductors respectively disposed on opposite faces of each of said plurality of printed circuit boards;
a plurality of spacers arranged to be disposed adjacent to each other in a row having two ends, each spacer arranged to allow one of said plurality of printed circuit boards to be disposed between it and another of said plurality of spacers; each face of each of said plurality of spacers including a groove for each of said electrical conductors of an adjacent printed circuit board, said groove arranged to provide an airspace between its spacer and said conductor of said adjacent printed circuit board, each of said electrical conductors having first and second ends, said printed circuit boards and said plurality of spacers being arranged to leave exposed, on a first plane, all of said first ends of said plurality of electrical conductors and to leave exposed, on a second plane, all of said second ends of said plurality of electrical conductors;
a pair of end pieces respectively arranged to be disposed adjacent said ends of said row of plurality of spacers;
a plurality of cells;
first and second interposers respectively arranged to be disposed adjacent said first and second planes, each interposer having an aperture arranged to receive one of said plurality of cells for each conductor pair of said plurality printed circuit boards; and
a plurality of electrically conductive contacts, each electrically conductive contact having first and second ends and being arranged to be respectively disposed in one of said cells of said first and second interposers, wherein said first end of each of said plurality of electrically conductive contacts respectively electrically contacts one of said conductor pairs of said plurality of printed circuit boards and wherein said second end of each of said plurality of electrically conductive contacts extends through its respective cell in its respective interposer beyond a plane of said interposer.

24. The system of claim 23, wherein each of said electrically conductive contacts comprises a leaf spring contact, one end of said spring contact comprising said first end of said respective electrically conductive contact and a second end of said spring comprising said second end of said electrically conductive contact.

25. The system of claim 24, wherein said one end of each of said spring contacts is arranged to provide a resilient force to urge it towards its respective electrical conductor to electrically connect it thereto.

26. The system of claim 23, wherein each cell comprises at least two springs arranged to provide a resilient force to urge said cell toward its respective interposer.

27. The system of claim 26, wherein each cell comprises cylindrical apertures arranged to receive said at least two springs.

28. The system of claim 23, wherein each cell comprises at least two tabs arranged to mate with corresponding slots in its respective aperture of its respective interposer.

29. The system of claim 23, wherein said at least one pair of electrical conductors of adjacent printed circuit boards are staggered to increase distances between said electrical conductors of said adjacent printed circuit boards.

30. The system of claim 23, wherein each printed circuit board comprises at least one aperture and each spacer comprises at least one boss on either side thereof, said at least one aperture of said printed circuit board arranged to mate with said at least one boss of said spacer.

31. The system of claim 23, further comprising a backbone including slots arranged to receive said plurality of spacers.

32. The system of claim 23, further comprising an end plate arranged to contain one of said interposers and to mate to said end caps.

33. The system of claim 23, further comprising a shield plate arranged to cover two sides of the interconnection system.

* * * * *